(12) United States Patent
Doornbos et al.

(10) Patent No.: US 9,871,104 B2
(45) Date of Patent: Jan. 16, 2018

(54) NANOWIRE SEMICONDUCTOR DEVICE STRUCTURE AND METHOD OF MANUFACTURING

(71) Applicant: Taiwan Semiconductor Manufacturing Company, Ltd., Hsin-Chu (TW)

(72) Inventors: Gerben Doornbos, Leuven (BE); Mark van Dal, Linden (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/755,083

(22) Filed: Jun. 30, 2015

(65) Prior Publication Data

US 2017/0005168 A1    Jan. 5, 2017

(51) Int. Cl.
| H01L 21/265 | (2006.01) |
|---|---|
| H01L 29/66 | (2006.01) |
| H01L 29/04 | (2006.01) |
| H01L 29/08 | (2006.01) |
| H01L 29/78 | (2006.01) |
| H01L 29/06 | (2006.01) |
| H01L 21/324 | (2006.01) |

(52) U.S. Cl.
CPC .... H01L 29/0847 (2013.01); H01L 21/26506 (2013.01); H01L 21/324 (2013.01); H01L 29/04 (2013.01); H01L 29/0673 (2013.01); H01L 29/0676 (2013.01); H01L 29/0688 (2013.01); H01L 29/66477 (2013.01); H01L 29/66666 (2013.01); H01L 29/78 (2013.01); H01L 29/7827 (2013.01)

(58) Field of Classification Search
CPC . H01L 29/0847; H01L 29/04; H01L 29/0673; H01L 29/0676; H01L 29/0688; H01L 29/66477; H01L 29/66666; H01L 29/78; H01L 29/7827; H01L 21/26506; H01L 21/324
USPC .............................................. 257/51; 438/308
See application file for complete search history.

(56) References Cited

U.S. PATENT DOCUMENTS

| 5,420,055 A * | 5/1995 | Vu .................... G02B 27/0093 |
|---|---|---|
| | | 257/E21.703 |
| 6,380,044 B1 * | 4/2002 | Talwar .............. H01L 21/26513 |
| | | 257/E21.324 |

(Continued)

OTHER PUBLICATIONS

Card, H. C., et al., "Opto-Electronic Processes at Grain Boundaries in Polycrystalline Semiconductors," 1976 International Electron Devices Meeting (IEDM), vol. 22, pp. 474-477.

(Continued)

*Primary Examiner* — Cuong Q Nguyen
*Assistant Examiner* — Tong-Ho Kim
(74) *Attorney, Agent, or Firm* — Slater Matsil, LLP

(57) ABSTRACT

A nanowire comprises a source region, a drain region and a channel region. The source region is modified to reduce the lifetime of minority carriers within the source region. In an embodiment the modification may be performed by implanting either amorphizing dopants or lifetime reducing dopants. Alternatively, the source may be epitaxially grown with a different materials or process conditions to reduce the lifetime of minority carriers within the source region.

20 Claims, 16 Drawing Sheets

(56) References Cited

U.S. PATENT DOCUMENTS

| | | | | |
|---|---|---|---|---|
| 2007/0281411 | A1* | 12/2007 | Murthy | H01L 29/7848 438/197 |
| 2009/0061568 | A1* | 3/2009 | Bangsaruntip | B82Y 10/00 438/151 |
| 2011/0133169 | A1* | 6/2011 | Bangsaruntip | B82Y 10/00 257/38 |
| 2012/0235152 | A1* | 9/2012 | Ota | H01L 29/0673 257/66 |
| 2013/0264644 | A1* | 10/2013 | Tsunomura | H01L 27/1203 257/350 |
| 2013/0277752 | A1* | 10/2013 | Glass | H01L 21/823821 257/369 |
| 2015/0171032 | A1* | 6/2015 | Colinge | H01L 23/60 257/355 |

OTHER PUBLICATIONS

Gu, J. J., et al., "20-80 nm Channel Length InGaAs Gate-all-around Nanowire MOSFETS with EOT=1.2nm and Lowest SS=63mV/dec," 2012 IEEE International Electron Devices Meeting, Dec. 10-13, 2012, pp. 27.6.1-27.6.4.

Hsu, S.H., et al., "Nearly Defect-free Ge Gate-All-Around FETs on Si Substrates," 2011 IEEE International Electron Devices Meeting (IEDM), pp. 35.2.1-35.2.4.

Lin, J., et al., "A New Self-aligned Quantum-Well MOSFET Architecture Fabricated by a Scalable Tight-Pitch Process," 2013 IEEE International Electron Devices Meeting (IEDM), pp. 16.2.1-16.2.4.

Lin, J., et al., "Off-State Leakage Induced by Band-to-Band Tunneling and Floating-Body Bipolar Effect in InGaAs Quantum-Well MOSFETs, " IEEE Electron Device Letters, vol. 35, Issue 12, 2014, pp. 1203-1205.

Peng, J.W., et al., "CMOS Coompatible Ge/Si Core/Shell Nanowire Gate-All-Around pMOSFET Integrated with Hf02/TaN Gate Stack, " 2009 IEEE International Electron Devices Meeting (IEDM), pp. 38.2.1-38.2.4.

Thelander, C., et al., "Vertical Enhancement-Mode InAs Nanowire Field-Effect Transistor with 50-nm Wrap Gate," IEEE Electron Device Letters, vol. 29, No. 3, Mar. 2008, pp. 206-208.

Tomioka, K. et al., "Vertical in 0.7Ga0.3As Nanowire Surrounding-Gate Transistors with High-k Gate Dielectric on Si Substrate," 2011 IEEE International Electron Devices Meeting (IEDM), pp. 33.3.1-33.3.4.

Xiang, J., et al., "Ge/Si Nanowire Heterostructures as High-Performance Field-Effect Transistors," Nature Letters, vol. 441/25 May 2006, pp. 489-493.

* cited by examiner

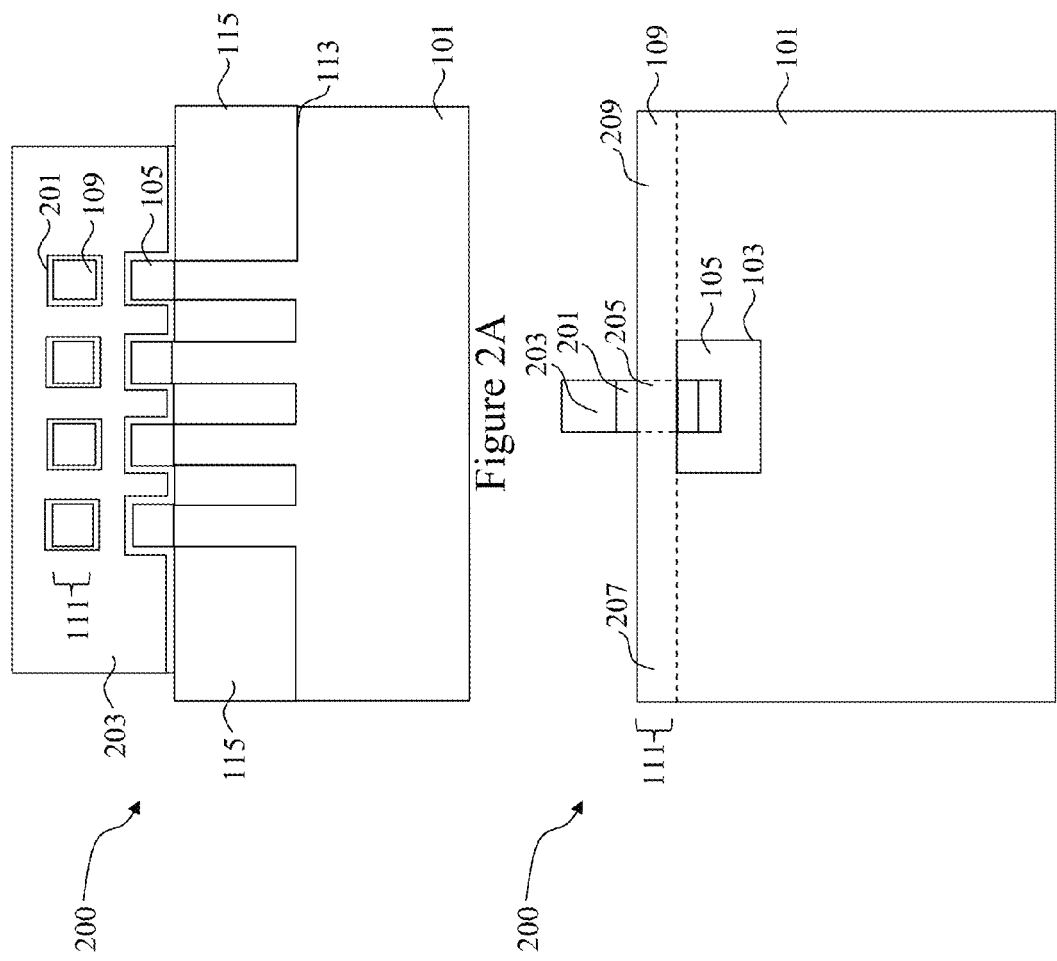

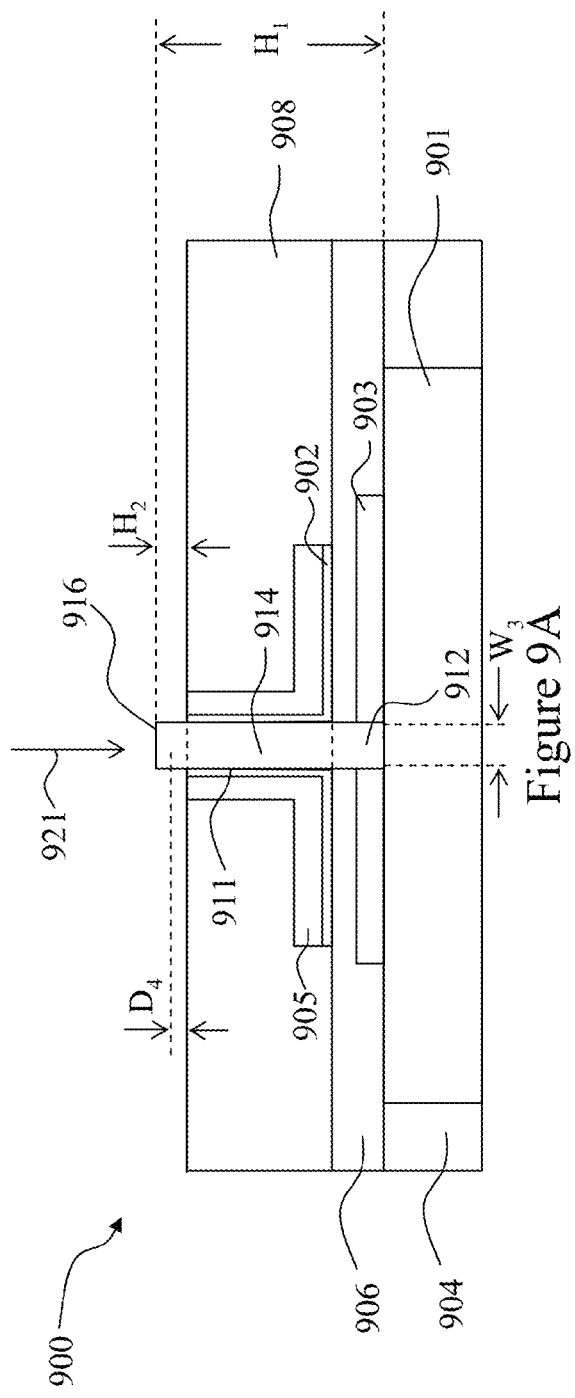
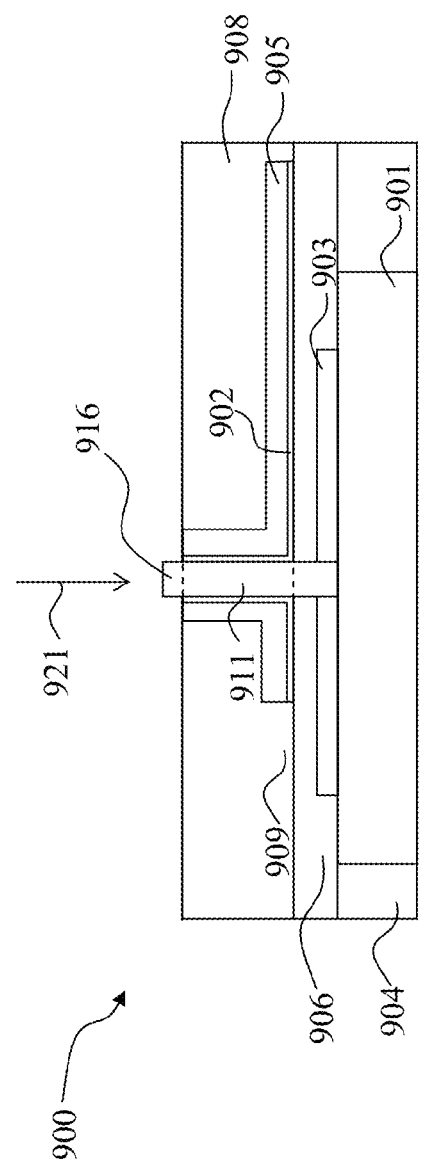

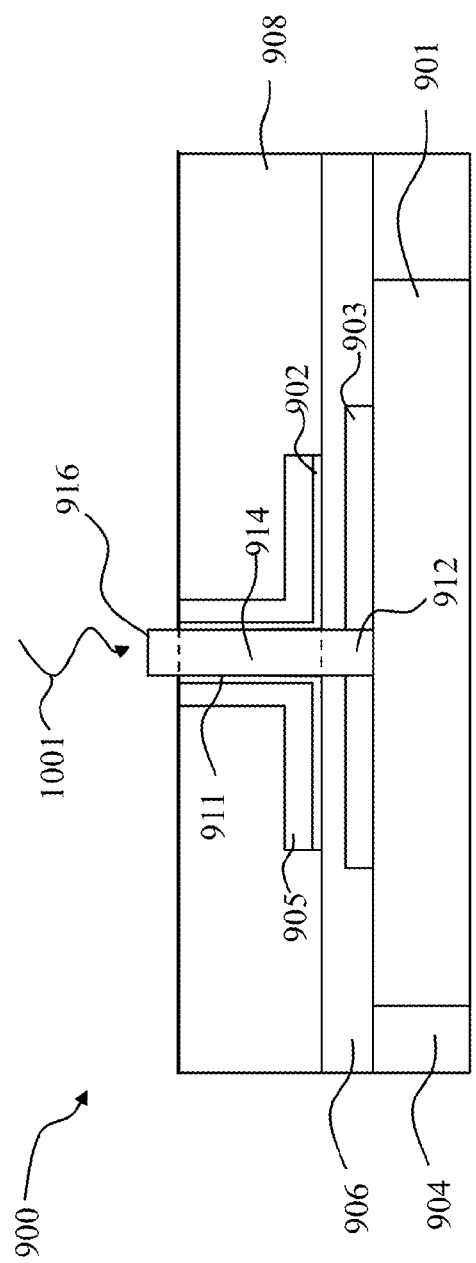
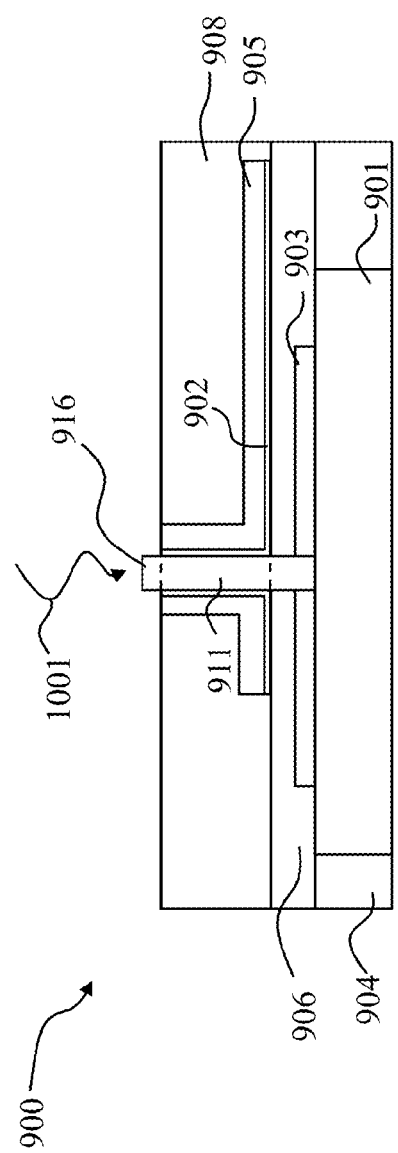
Figure 10A
Figure 10B

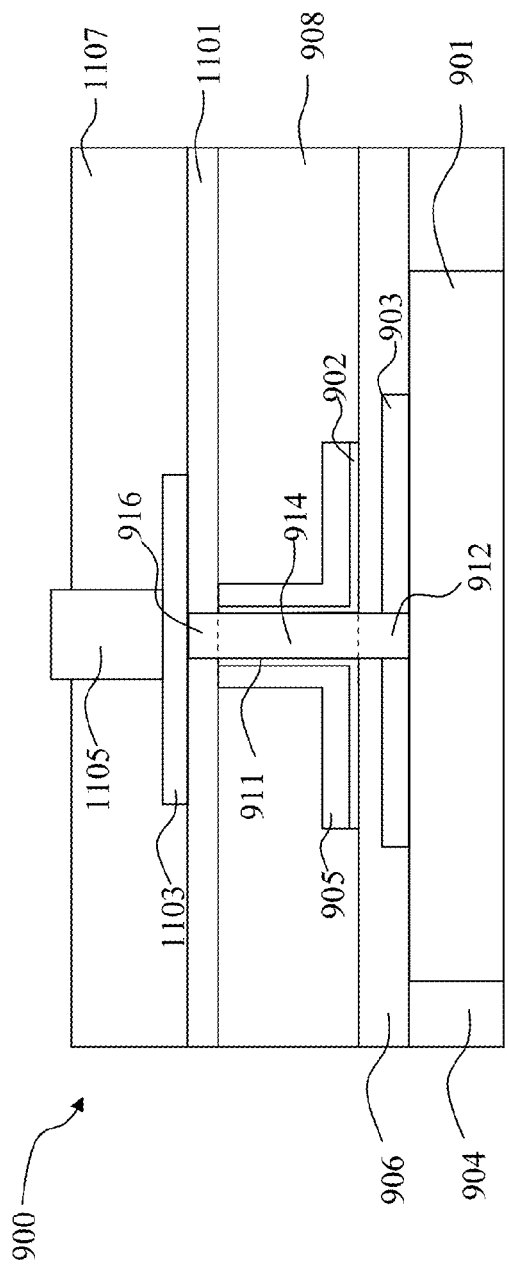
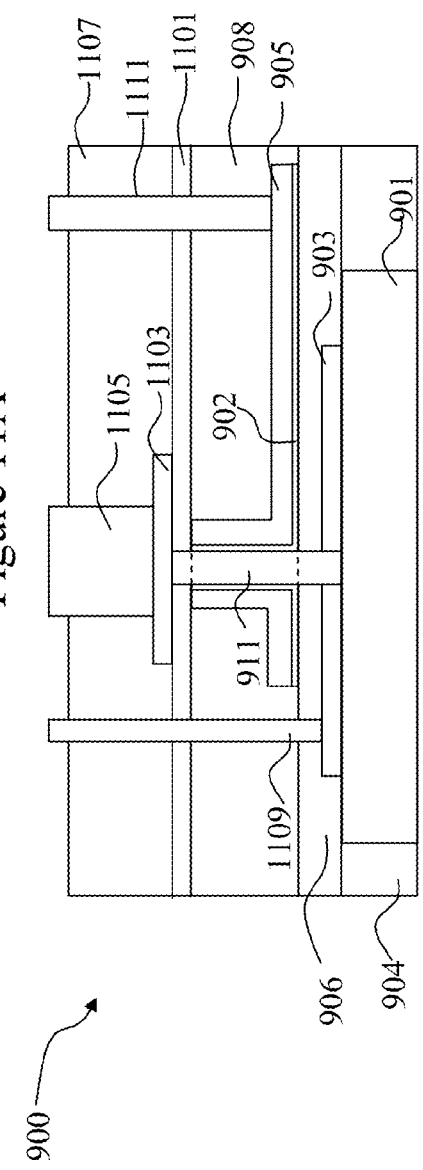
Figure 11A
Figure 11B

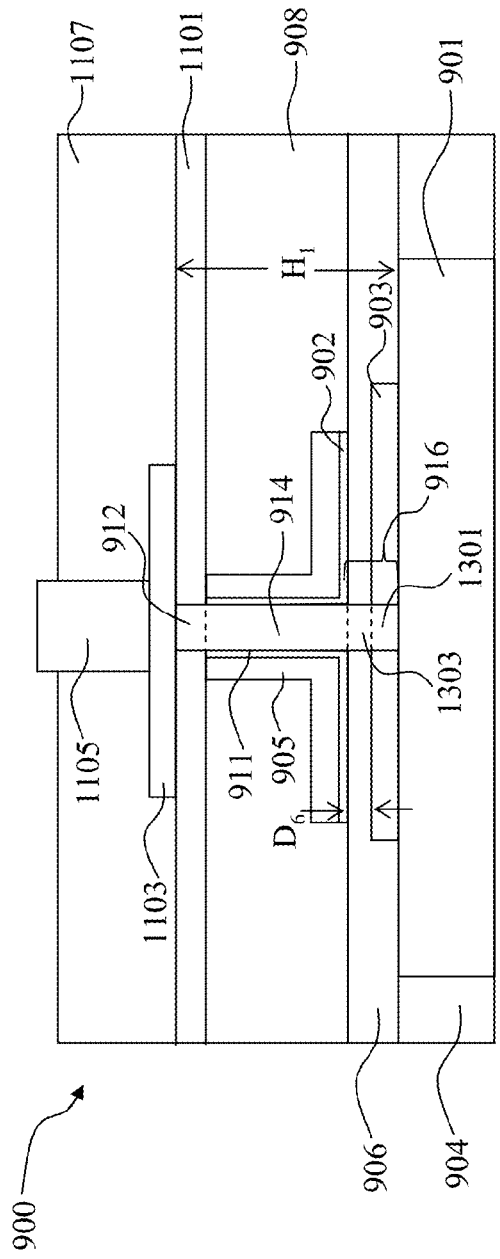
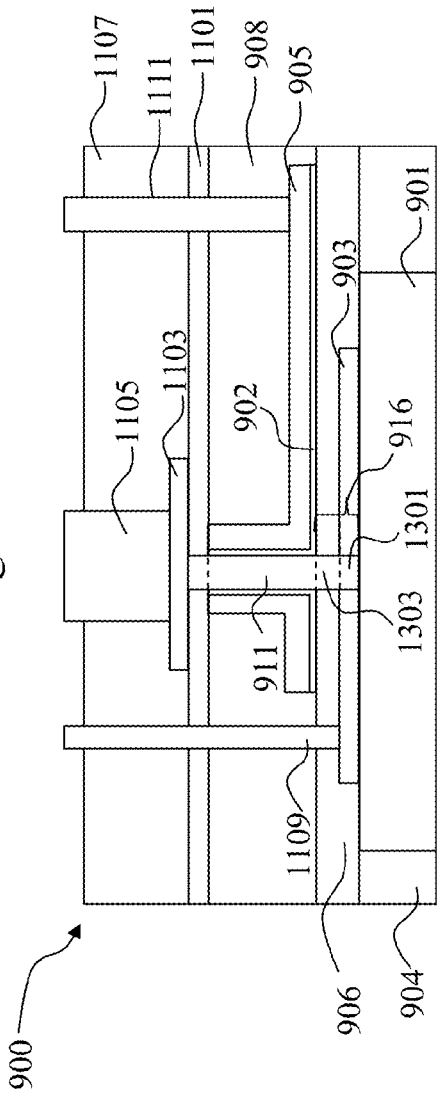
Figure 15A
Figure 15B

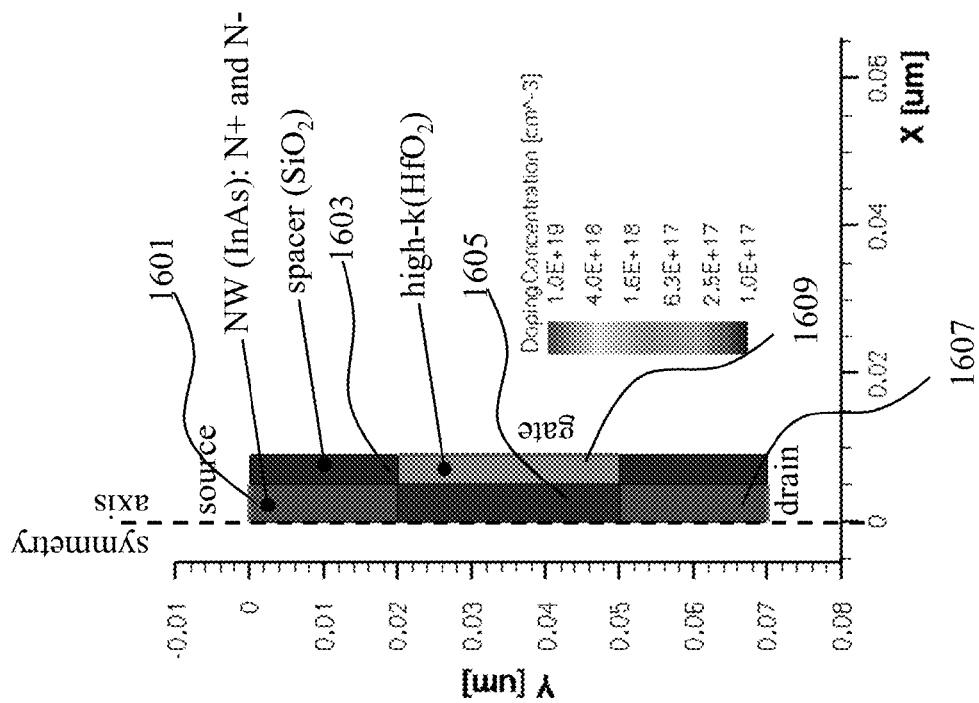
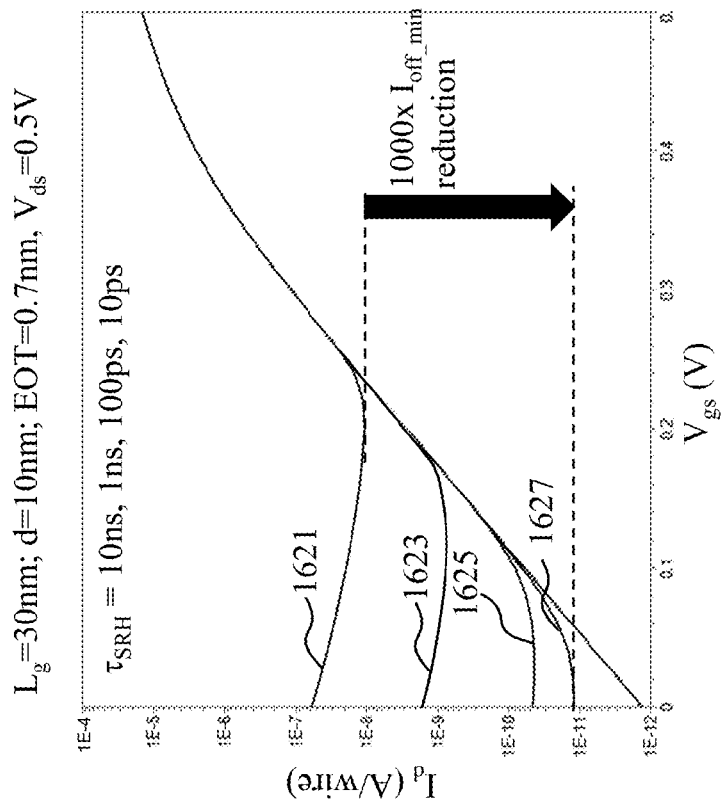
Figure 16A
Figure 16B

NANOWIRE SEMICONDUCTOR DEVICE STRUCTURE AND METHOD OF MANUFACTURING

BACKGROUND

Transistors are key components of modern integrated circuits. To satisfy the desires of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architectures may help the relief of short-channel effects by improving electrostatic control of the gate on the channel. Fin field-effect transistors (FinFET) were thus developed. To further increase the control of the gate on the channels, and to reduce the short-channel effects, transistors having gate-all-around structures were also developed, wherein the respective transistors are also referred to as gate all around transistors. In a gate all around transistor, a gate dielectric and a gate electrode fully encircle the channel region. This configuration delivers a good control of the gate on the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B illustrate a formation of a gate all around transistor in accordance with some embodiments.

FIGS. 9A-9B illustrate a vertical gate all around in accordance with some embodiments.

FIGS. 10A-10B illustrate an anneal in accordance with some embodiments.

FIGS. 11A-11B illustrate formation of the vertical gate all around in accordance with some embodiments.

FIGS. 15A-15B illustrate a VGAA transistor with the third source region adjacent to the substrate in accordance with some embodiments.

FIGS. 16A-16B illustrate test data of reducing a minority carrier lifetime within a nanowire in accordance with some embodiments.

DETAILED DESCRIPTION

Figure 1A:
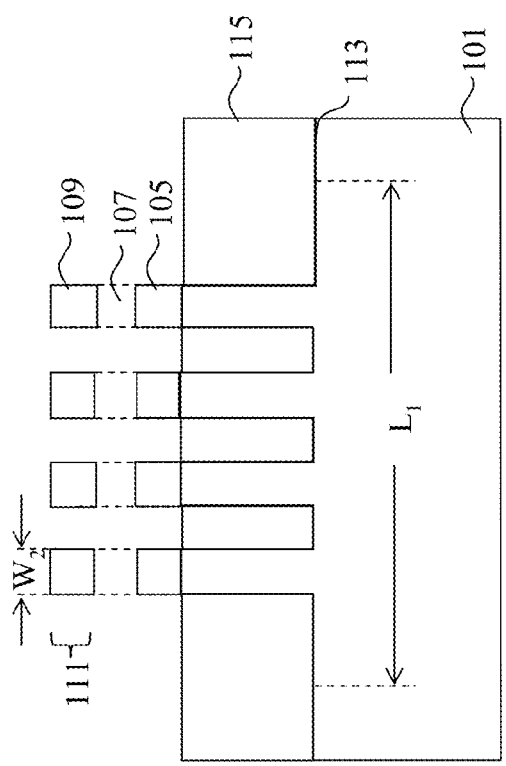
FIGS. 1A-1B illustrate a formation of a nanowire in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
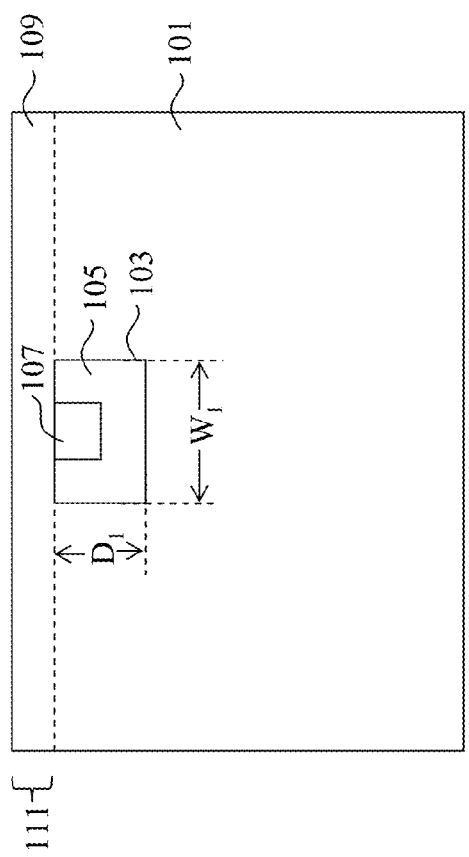

With reference now to FIGS. 1A-1B (with FIG. 1B being a right angle view of FIG. 1A), there is illustrated an intermediate structure within a process to form horizontal nanowire active devices 200 (not illustrated in FIGS. 1A-1B but illustrated and discussed below with respect to FIG. 2). In an embodiment the horizontal nanowire active device 200 is formed by initially providing a substrate 101 such as a semiconductor substrate, which may be, for example, a silicon substrate, a silicon germanium substrate, a germanium substrate, a III-V material substrate, or a substrate formed of other semiconductor materials with, for example, high band-to-band tunneling (BTBT). The substrate 101 may be doped with a p-type or an n-type impurity. In some embodiments, the substrate 101 is a bulk substrate. Alternatively, the substrate 101 may be a Semiconductor-on-Insulator (SOI) substrate.

A trench 103 may be formed, for example, through anisotropic etching. In some embodiments, the trench 103 may have a first depth $D_1$ (FIG. 1B) that is between about 8 nm and about 40 nm, a first width $W_1$ of between about 8 nm and about 40 nm, and a first length $L_1$ (not fully illustrated in FIG. 1A because of further processing but illustrated by dashed lines) of between about 10 nm and about several hundred nanometers. It is appreciated that the values recited throughout the description are merely examples, and may be changed to different values.

Next, a first epitaxy layer 105 is grown within the trench 103 using an epitaxy step. The formation of the first epitaxy layer 105 may include a blanket epitaxy, so that the first epitaxy layer 105 is grown on the exposed surfaces of the substrate 101. The first epitaxy layer 105 initially includes a portion inside the trench 103 and portions outside the trench 103. A Chemical Mechanical Polish (CMP) is then performed to remove portions of the first epitaxy layer 105 outside of the trench 103, while the portion of the first epitaxy layer 105 inside the trench 103 remains. The top edge of the remaining portion of first epitaxy layer 105 is thus level with the top surface of substrate 101. The epitaxy may be conformal, so that the sidewall portions of the first epitaxy layer 105 (on sidewalls of the trench 103) and the bottom portion of the first epitaxy layer 105 have substantially the same thickness, such as between about 4 nm and about 20 nm.

The first epitaxy layer 105 may be formed of a first semiconductor material. In some embodiments, the first epitaxy layer 105 comprises $Si_xGe_{1-x}$, wherein X is greater than 0 and smaller than 1, and may be, for example, between about 0.7 and 0.9. In alternative embodiments, the first epitaxy layer 105 is a semiconductor layer doped with an impurity having a first doping concentration. For example, the first epitaxy layer 105 may be a silicon layer doped with arsenic, phosphorous, boron, gallium, indium, antimony, oxygen, nitrogen, or combinations thereof. The first doping concentration may be, for example, between about $1 \times 10^{15}/cm^3$ and about $4 \times 10^{18}/cm^3$.

Next, a second epitaxy layer (not still present in FIGS. 1A-1B but illustrated in ghost using dashed lines labeled 107) is formed using an epitaxy step, followed by a CMP. The resulting second epitaxy layer 107 fills the entirety of the remaining part of the trench 103 (not already filled by the first epitaxy layer 105), with the top surfaces of the first epitaxy layer 105 and the second epitaxy layer 107 level with the top surface of the substrate 101. In an embodiment the second epitaxy layer 107 is formed of a second material that differs from the first semiconductor material of the first epitaxy layer 105, with the difference significant enough so that in subsequent steps, the second epitaxy layer 107 may be selectively etched, and the first epitaxy layer 105 remains. The second epitaxy layer 107 may be a semiconductor layer. In some embodiments, for example, when the first epitaxy layer 105 comprises $Si_xGe_{1-x}$, the second epitaxy layer 107 may comprise $Si_yGe_{1-y}$, wherein value Y is greater than 0 and smaller than 1, and is different from value X. For example, value Y may be between about 0.4 and 0.9.

In alternative embodiments wherein the first epitaxy layer 105 is a semiconductor layer doped with an impurity having the first doping concentration, the second epitaxy layer 107 may also be doped with the same impurity (or different impurities) to a second doping concentration different from the first doping concentration. For example, the second epitaxy layer 107 may be a silicon layer doped with arsenic, phosphorous, boron, gallium, indium, antimony, oxygen, nitrogen, or combinations thereof. The second doping concentration may be, for example, between about $8 \times 10^{19}/cm^3$ and about $8 \times 10^{18}/cm^3$, wherein a ratio of the second doping concentration to the first doping concentration may be greater than about 2, greater than about 5, or greater than about 10.

Once the first epitaxy layer 105 and the second epitaxy layer 107 have been formed, a semiconductor layer 109 may be formed over the first epitaxy layer 105 and the second epitaxy layer 107. In an embodiment the semiconductor layer 109 may be formed through a process such as epitaxy.

In some embodiments, the semiconductor layer 109 comprises a material selected from silicon, germanium, silicon germanium, III-V compound semiconductor materials such as indium gallium arsenide or indium arsenide, combinations thereof, and the like. The semiconductor layer 109 may also comprise silicon, and may be substantially free from germanium. The semiconductor layer 109 may be undoped, although it may also be lightly doped, with n-type and p-type impurities. After the epitaxy, a further CMP may be performed to planarize the top surface of the semiconductor layer 109. In some embodiments, the semiconductor layer 109 may have a thickness of between about 5 nm and about 40 nm.

Once the semiconductor layer 109 has been formed, trenches may be formed through the semiconductor layer 109, the second epitaxial layer 107, the first epitaxial layer 105, and the substrate 101 in order to pattern the semiconductor layer 109 into multiple horizontal nanowires 111 (with longitudinal axes that are parallel with a major surface of the substrate 101) oriented along the <110> crystalline orientation, wherein each one of the horizontal nanowires 111 (four of which are illustrated in FIG. 1A), are at this point resting on a portion of the second epitaxial layer 107, a portion of the first epitaxial layer 105, and the substrate 101. In an embodiment the patterning may be performed using a photolithographic masking and etching process, wherein a first photoresist is applied, exposed to a patterned energy source, and developed. The first photoresist is then used along with an etching process, such as a reactive ion etch, in order to transfer the pattern of the first photoresist into the underlying layers, such as the semiconductor layer 109, the second epitaxial layer 107, the first epitaxial layer 105, and the substrate 101. However, any suitable patterning process may alternatively be utilized. In some exemplary embodiments, the horizontal nanowires 111 will each have a second width $W_2$ of between about 10 nm and about 60 nm.

In addition to the patterning of the semiconductor layer 109, the etch process will also form second trenches 113 into the substrate 101. In an embodiment the second trenches 113 extend further into the substrate 101 than the trench 103 and, as such, have bottom surfaces lower than the first epitaxy layer 105.

Once the second trenches 113 have been formed into the substrate 101, a dielectric material is filled into the bottom portions of second trenches 113 to form insulation regions 115. The insulation regions 115 may be Shallow Trench Isolation (STI) regions, and may be formed by filling and overfilling the trenches 113 with a dielectric material and the planarizing the dielectric material with the top level of the semiconductor layer 109 using a process such as chemical mechanical polishing. Once planarized, the dielectric material may be selectively etched to recess the dielectric material and form the insulation regions 115. In some embodiments the top surfaces of the insulation regions 115 are substantially level with a bottom surface of the first epitaxy layer 105. In alternative embodiments, the top surfaces of the insulation regions 115 may be substantially level with a top surface of the bottom portion of the first epitaxy layer 105. In yet alternative embodiments, the top surfaces of the insulation regions 115 may be at any level.

Once the insulation regions 115 have been formed, the remaining portions of the second epitaxy layer 107 are selectively etched away, and the first epitaxy layer 105, the substrate 101, the semiconductor layer 109, and the insulation regions 115 are not etched. Such an etching process releases the semiconductor layer 109 such that portions of the semiconductor layer 109 that were previously in contact with the second epitaxy layer 107 are now exposed.

In an embodiment the release etch may use an etchant that is selected according to the materials of the second epitaxy layer 107, the substrate 101, and the semiconductor layer 109. In accordance with some embodiments, with either different percentages of silicon and germanium in the first epitaxy layer 105 and the second epitaxy layer 107, or different doping concentrations in the first epitaxy layer 105 and the second epitaxy layer 107, an appropriate etchant may be selected to have an adequate etching selectivity for the second epitaxy layer 107. For example, with the second epitaxy layer 107 comprising SiGe with different germanium percentages, $NH_4OH:H_2O_2$ and $H_2O_2$, $HF:H_2O_2$: $CH_3COOH$, or tetramethylammonium hydroxide (TMAH)-based solutions may be used as the etchant.

In an embodiment the released semiconductor layer 109 has a central section that is exposed and suspended without being directly supported. Additionally, there are portions on either side of the central section that are supported either by the substrate itself 101 or else by the material of the first epitaxial layer 105.

Optionally, the first epitaxy layer 105 may be selectively oxidized, for example, in a thermal oxidation process performed in an oxygen-containing environment. Depending on the composition of the first epitaxy layer 105, the oxide regions formed from the first epitaxy layer 105 may comprise a silicon oxide, a silicon germanium oxide, or the like. If there is a composition difference between the semiconductor layer 109 and first epitaxy layer 105, the oxidation rate of first epitaxy layer 105 may be significantly greater than the oxidation rate of the semiconductor layer 109. In one embodiment, the difference in oxidation rates is due to the difference in doping concentrations in the semiconductor layer 109 and the first epitaxy layer 105. For example, when the first epitaxy layer 105 is formed of SiGe, the oxidation rate of the first epitaxy layer 105 may be 7 to 30 times the oxidation rate of the silicon-based (free from germanium) semiconductor layer 109. The first epitaxy layer 105 may be oxidized entirely. As a comparison, a thin surface layer of the semiconductor layer 109 that is exposed is oxidized, and the inner portion of the semiconductor layer 109 remains not oxidized.

However, as one of ordinary skill will recognize, the process described above for forming horizontal nanowires, which may be considered, an "STI-last" approach wherein an epitaxial heterostack (e.g. SiGe/Si) is made first, then STI is formed, STI oxide is etched-back and the wires are released by SiGe selective etch, is merely one illustrative example and is not intended to limiting upon the embodiments. Rather, any suitable method of formation, such as an "STI first" or "replacement fin" approach, wherein the STI is formed, a top of the Si fin is replaced with the heterostack, the STI oxide is etched back and the wires are released, may alternatively be utilized. All such processes are fully intended to be included within the scope of the embodiments.

FIGS. 2A and 2B (with FIG. 2B being a right angle view of FIG. 2A) illustrate a formation of a gate stack comprising gate dielectric 201 and a gate electrode 203 on the gate dielectric 201. The formation of the gate dielectric 201 and the gate electrode 203 may include forming a blanket gate dielectric layer using a conformal method, forming a blanket gate electrode, and patterning the gate stack. Gate dielectric 201 may include a thin oxide layer, which may be formed as the result of the optional oxidation step discussed above with respect to FIGS. 1A-1B. The gate dielectric 201 may alternatively include a high-k dielectric layer(s) that is formed of a high-k dielectric material such as hafnium oxide, zirconium oxide, or the like. Other oxides and/or nitrides of Hf, Al, La, Lu, Zr, Ti, Ta, Ba, Sr, Pb, and/or the like, may also be used in gate dielectric 201. The gate electrode 203 may include Ti, Ta, W, Mo, Ru, Pt, Co, Ni, Pd, Nb, or alloys thereof or compound metals such as TiN, TaC, or TaN.

As illustrated, the gate dielectric 201 wraps around the suspended horizontal nanowires 111, and the gate electrode 203 wraps around gate dielectric 201. The suspended horizontal nanowires 111 surrounded by the gate dielectric 201 and the gate electrode 203 thus form the first channel region 205 of the MOSFET, with a first side of the horizontal nanowires 111 not surrounded by the gate dielectric 201 and the gate electrode 203 forming a first source region 207 and a second side of the horizontal nanowires 111 not surrounded by the gate dielectric 201 and the gate electrode 203 (and on an opposite side of the first channel region 205) forming a drain region 209. The first source region 207 and the drain region 209 may be formed, for example, by implanting the portions of the horizontal nanowire 111 with a suitable dopant. The sources in the plurality of horizontal nanowires 111 may be interconnected to form a source region, and the drains in the plurality of horizontal nanowires 111 may be interconnected to form a drain region.

However, during operation of the active devices (e.g., nanowire MOSFET devices) that are formed with the horizontal nanowires 111, minority carriers (not separately illustrated in FIGS. 2A-2B because of their small size) are generated at the interface between the drain region 209 and the first channel region 205. These minority carriers (which in a planar transistor would usually migrate into a bulk region of the substrate 101 below the channel region) have nowhere to go within the first channel region 205, as the first channel region 205 is formed from the horizontal nanowire 111 which is surrounded by the gate dielectric 201. If left unchecked within the first channel region 205, these minority carriers can negatively impact the performance of the active devices formed from the horizontal nanowires 111 by amplifying band-to-band tunneling (BTBT), which limits the off-current of devices formed from the horizontal nanowires 111.

Figure 3:
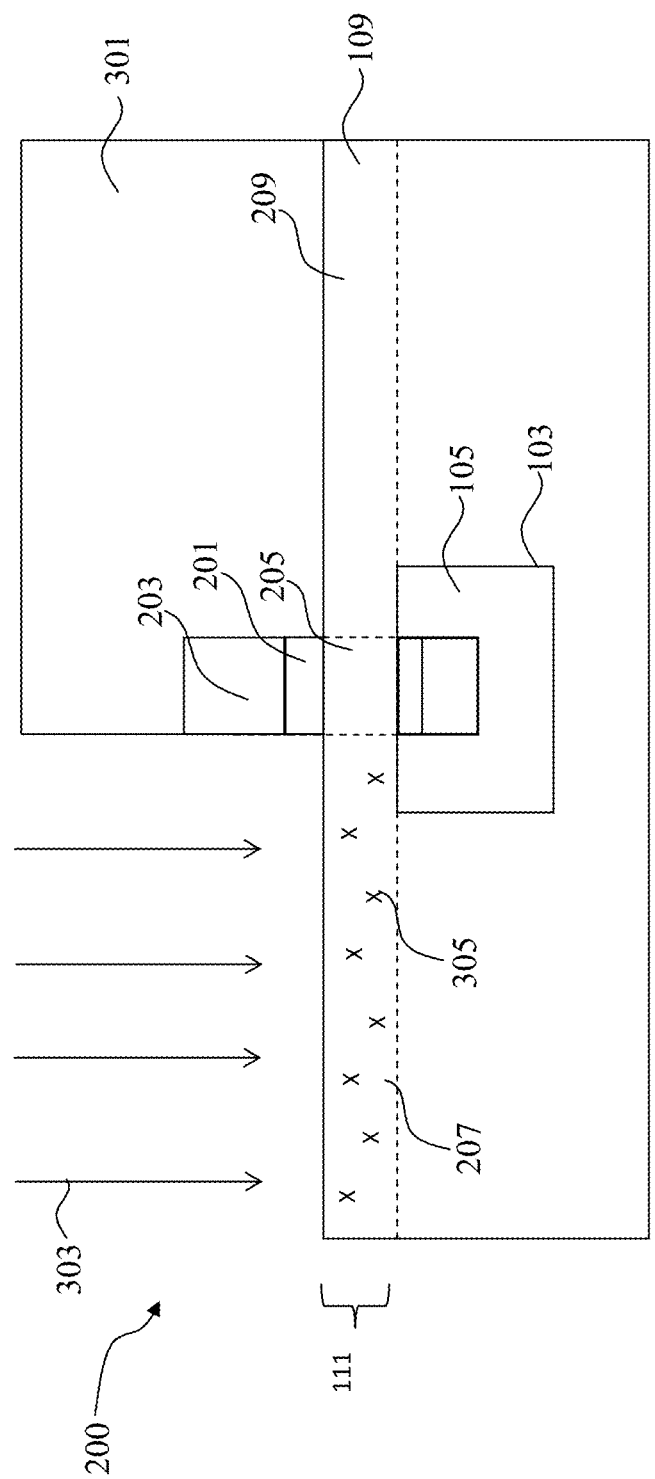
FIG. 3 illustrates an implantation of amorphizing dopants into a source in accordance with some embodiments.

FIG. 3 illustrates one embodiment of a process to assist in the removal of the minority carriers from the first channel region 205. In an embodiment the process may be started (after formation of the gate dielectric 201 and the gate electrode 203) by initially covering the first channel region 205 and the drain region 209 with an first implantation mask 301. In an embodiment the first implantation mask 301 may be a second photoresist that is first applied and then patterned to cover the first channel region 205 and the drain region 209 while leaving the first source region 207 exposed. The patterning of the second photoresist may be performed by exposing the second photoresist to a patterned energy source (e.g., light) to induce a chemical reaction in those portions of the second photoresist exposed to the energy, and then developing the second photoresist to remove the undesired portions of the second photoresist to form the first implantation mask 301.

Alternatively, the first implantation mask 301 may be a hard mask made of a dielectric material such as silicon nitride. In this embodiment the dielectric material may be initially deposited using a deposition process such as chemical vapor deposition, physical vapor deposition, or the like. Once the dielectric material has been deposited, a photolithographic masking and etching process may be performed, whereby a third photoresist (not separately illustrated in FIG. 3) is placed over the dielectric material, exposed to the patterned energy source, and developed. The patterned third photoresist is then used as a mask along with an etching process (such as a reactive ion etch) to transfer the pattern of the third photoresist to the dielectric material and form the first implantation mask 301.

Once the first implantation mask 301 has been formed to cover the first channel region 205 and the drain region 209, a first implantation (represented in FIG. 3 by the arrows labeled 303) is performed in order to implant first dopants (represented in FIG. 3 by the Xs labeled 305) into the first source region 207. In an embodiment the first dopants 305 are amorphizing species that will work to amorphize the first source region 207, and may be, e.g., argon, krypton, xenon, germanium, gallium, other column III, IV, or IV materials, combinations of these, or the like. Alternatively, the first dopants 305 may be amorphizing species that will also work as active dopants along with the dopants that are already present within the first source region 207, such as indium, arsenic, combinations of these, or the like.

In an embodiment the first implantation process 303 may be a process such as an ion implantation, whereby ions of the desired first dopants 305 are accelerated and directed towards the first source region 207. The ion implantation process may utilize an accelerator system to accelerate ions of the first dopants 305 with an energy of from about 1 keV to about 40 keV, such as about 3 keV. In an embodiment the first implantation process 303 will implant the first dopants 305 into the first source region 207 to a concentration of between about $10^{19}/cm^3$ to about $5 \times 20^{20}/cm^3$, although any suitable concentration may alternatively be utilized.

Figure 4:
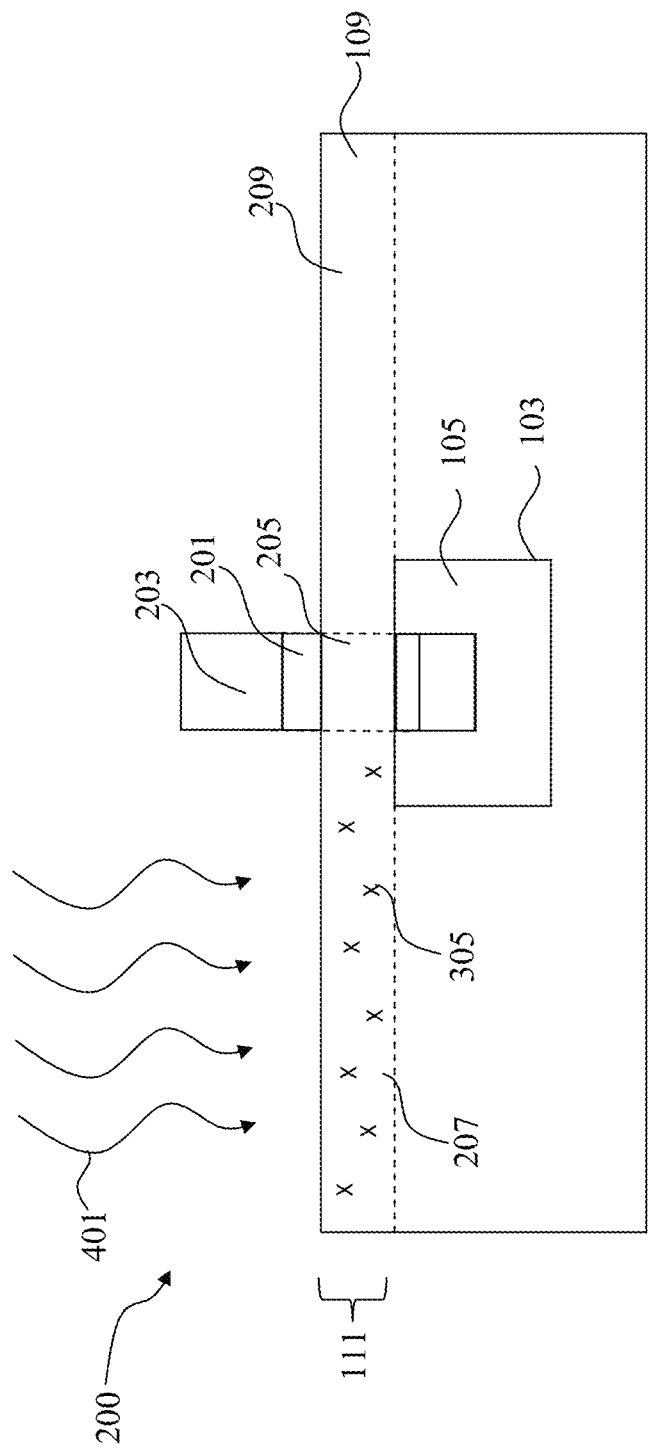
FIG. 4 illustrates an anneal of the source in accordance with some embodiments.

FIG. 4 illustrates a removal of the first implantation mask 301 and a first anneal process (represented in FIG. 4 by the arrows labeled 401) that may be used to recrystallize the first source region 207 after the first implantation process 303 implants the first dopants 305. In an embodiment in which the first implantation mask 301 is the second photoresist, the first implantation mask 301 may be removed using a process such as ashing, whereby the temperature of the second photoresist is increased until the second photoresist undergoes a thermal decomposition and may then be easily removed. However, any suitable removal process, such as etching, may alternatively be utilized to remove the first implantation mask 301.

Once the first implantation mask 301 has been removed, the first anneal process 401 may be performed. In an embodiment the first anneal process 401 may be a thermal anneal wherein the substrate 101 is heated within, e.g., a furnace, within an inert atmosphere. The first anneal process 401 may be performed at a temperature of between about 300° C. and about 1000° C., such as about 400° C., and may be continued for a time of between about 1 s and about 30 min, such as about 1 min.

By implanting the first dopants 305 and then performing the first annealing process 401, the first source region 207 will first be amorphized and then undergo a non-ideal epitaxial regrowth. As such, the material of the first source region 207 will reform to be a polycrystalline material within the first source region 207 while the material within the first channel region 205 and the first drain region 209 remain crystalline. In an embodiment the polycrystalline material may have a grain size of between about almost 0 (e.g., fully amorphous) and about 20 nm, but no larger than the diameter of the horizontal nanowire 111. Additionally, some of the first dopants 305 may outdiffuse during the first anneal process 401.

However, by recrystallizing the first source region 207 into a polycrystalline material, and generating the grain boundaries as described above, a Shockley-Read-Hall recombination process between holes and electrons may be stimulated within the first source region 207, causing minority carriers that are already present within the first source region 207 to have a reduced lifetime within the first source region 207. For example, a lifetime for minority carriers within a lower quality material such as a polycrystalline material (e.g., the first source region 207 after the implantation of the first dopants 305 and the recrystallization) may be 1000 times lower than within a crystalline material (e.g., the first source region 207 prior to the implantation of the first dopants 305). As such, the minority carriers within the first source region 207 will, over time, have a reduced concentration as more of the minority carriers undergo recombination and have a lifetime reduced by 1000 times, and this reduced concentration will generate a concentration gradient between the first source region 207 and the first channel region 205. As such, the minority carriers generated at the boundary between the first channel region 205 and the drain region 209 will be driven towards and into the first source region 207, thereby removing them from the first channel region 205. This helps to reduce a parasitic bipolar effect that amplifies band-to-band tunneling leakage within nanowires and helps to reduce the off-current of the horizontal nanowire active device 200 by 1000 times.

Figure 5:
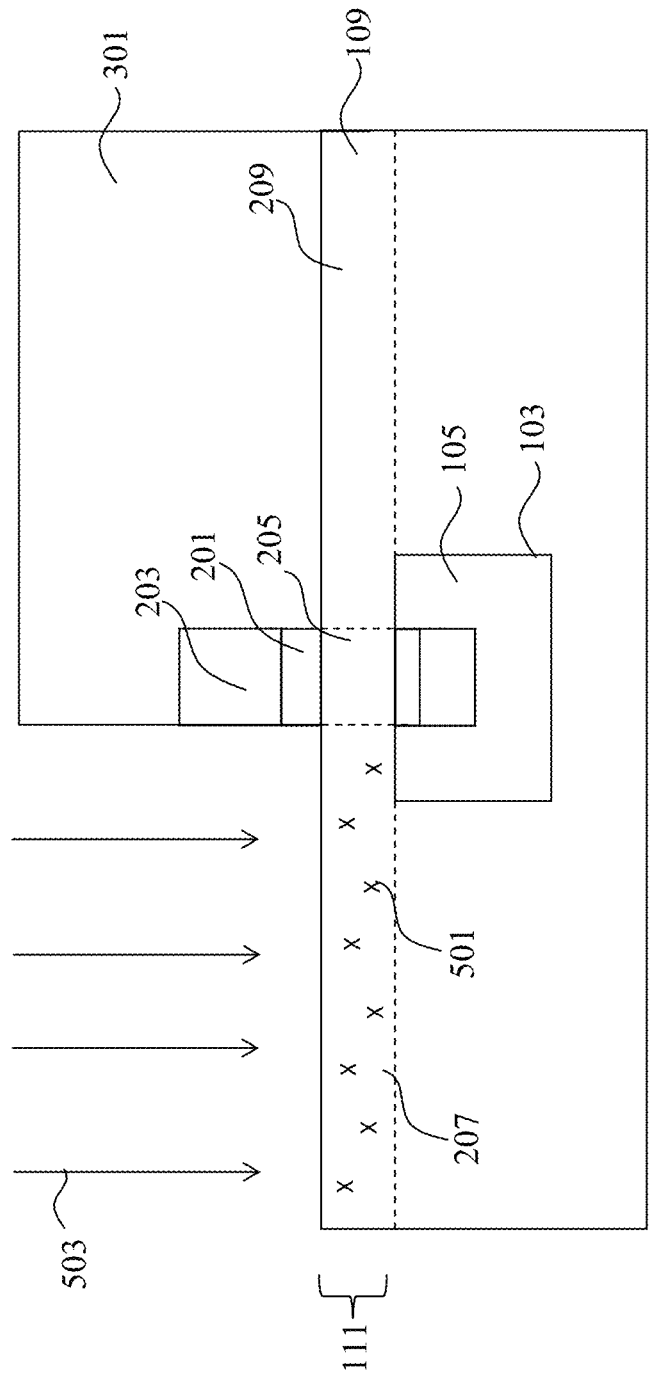
FIG. 5 illustrates an implantation of lifetime killing dopants into a source in accordance with some embodiments.

FIG. 5 illustrates another embodiment in which, instead of the first dopants 305 being implanted in order to amorphize the first source region 207 (as described above with respect to FIG. 3), second dopants (represented in FIG. 5 by the Xs labeled 501) are implanted into the first source region 207 in order to directly reduce the lifetime of the minority carriers within the first source region 207. In this embodiment the second dopants 501 are lifetime-reducing impurities that create deep trap states in the material of the first source region 207, such as nickel, cobalt, titanium, tantalum, oxygen, magnesium, iron, combinations of these, or the like.

In an embodiment the second dopants 501 may be implanted using a second implantation process (represented in FIG. 5 by the arrows labeled 503). In an embodiment the second implantation process 503 is similar to the first implantation process 303 (discussed above with respect to FIG. 3). For example, the second implantation process 503 may be an ion implantation process whereby the desired ions of the second dopants 501 are implanted using an energy of between about 1 keV and 20 keV, such as about 3 keV. However, any suitable implantation process may alternatively be utilized.

The second dopants 501 may be implanted to a concentration suitable to reduce the lifetime of minority carriers within the first source region 207. As such, while the precise concentration is dependent at least in part upon the materials utilized for the second dopants 501 and the first source region 207, in an embodiment in which the second dopants 501 are iron and the first source region 207 is silicon, the second dopants 501 may have a concentration of greater than about $10^{13}/cm^3$. However, any other suitable concentrations, such as a concentration of between about $10^{14}/cm^3$ to about $10^{18}/cm^3$, may alternatively be utilized.

Once the second dopants 501 have been implanted into the first source region 207, a second anneal process (not separately illustrated in FIG. 5) may be performed in order to repair any damage from the second implantation process 503. In an embodiment the second anneal process may be performed similar to the first anneal process 401 (discussed above with respect to FIG. 4). For example, the second anneal process may be performed by placing substrate 101 within, e.g., a furnace at a temperature of between about 300° C. and about 1000° C., such as about 400° C., for a time of between about 1 s and about 30 min, such as about 1 min. However, any suitable annealing process may be utilized.

By implanting the second dopants 501 which will directly reduce the lifetime of the minority carriers, the recombination of minority carriers within the first source region 207 will be enhanced, which will lead, over time, to a smaller concentration of minority carriers in the first source region 207. This lowered concentration of minority carriers will work to remove the minority carriers from the first channel region 205, thereby increasing the efficiency of the overall device.

Figure 6:
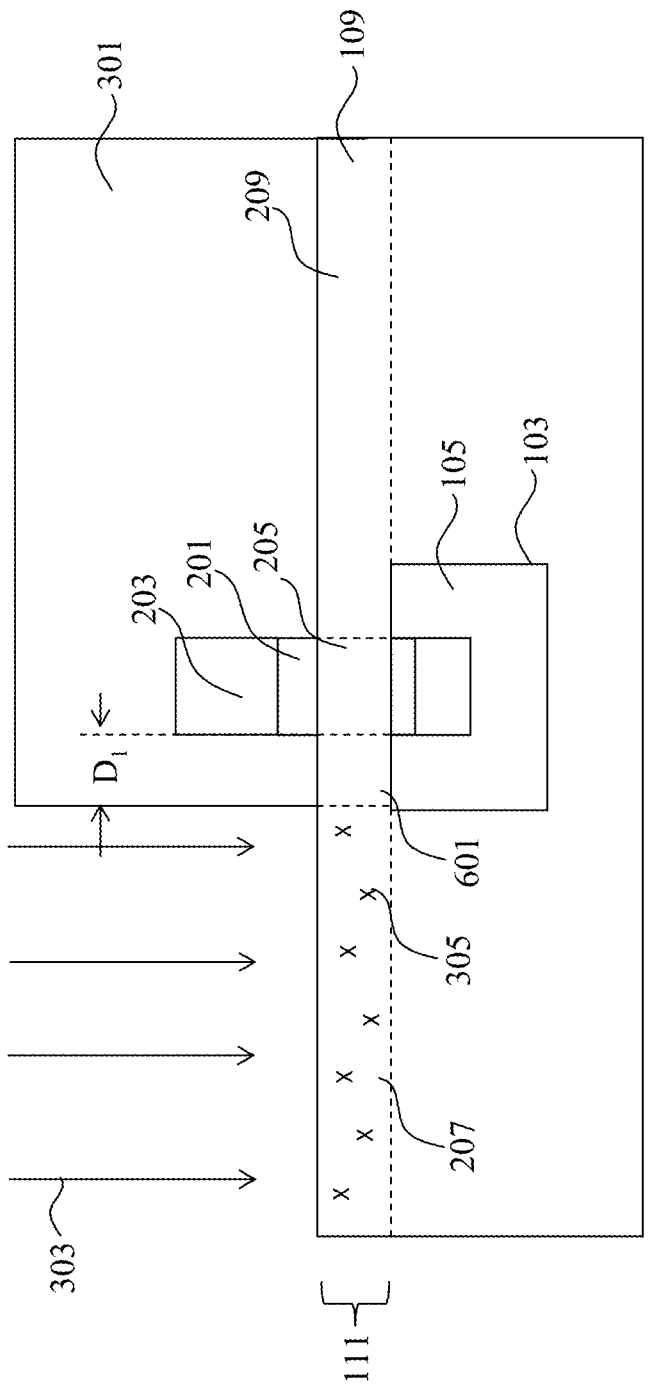
FIG. 6 illustrates an offset of the implantation in accordance with some embodiments.

FIG. 6 illustrates another embodiment in which the first dopants 305 are implanted into the first source region 207. In this embodiment, however, the first implantation mask 301 is formed to cover a first portion 601 of the first source region 207 in addition to the gate electrode 203 and the drain region 209. In an embodiment the first portion 601 may be separated a first offset from the gate electrode 203 and the gate dielectric 201 by a first distance $D_1$ of less than about 10 nm.

Once the first implantation mask 301 has been formed to cover the first portion 601 of the first source region 207, the first dopants 305 may be implanted into the first source region 207 where the first source region 207 is not covered by the first implantation mask 301. In an embodiment the first dopants 305 may be implanted using the first implantation process 303 (discussed above with respect to FIG. 3) and the first source region 207 may then be annealed using the first annealing process 401 (as discussed above with respect to FIG. 4).

By covering the first portion of the first source region 207 with a lateral offset from the boundary of the first source region 207 and the first channel region 205, the first source region 207 may still be recrystallized to promote recombination and assist in removal of minority carriers from the first channel region 205. However, with the offset, the first implantation process 303 will have a smaller effect on the barrier between the first source region 207 and the first channel region 205, thereby helping to keep the barrier free of defects.

Figure 7:
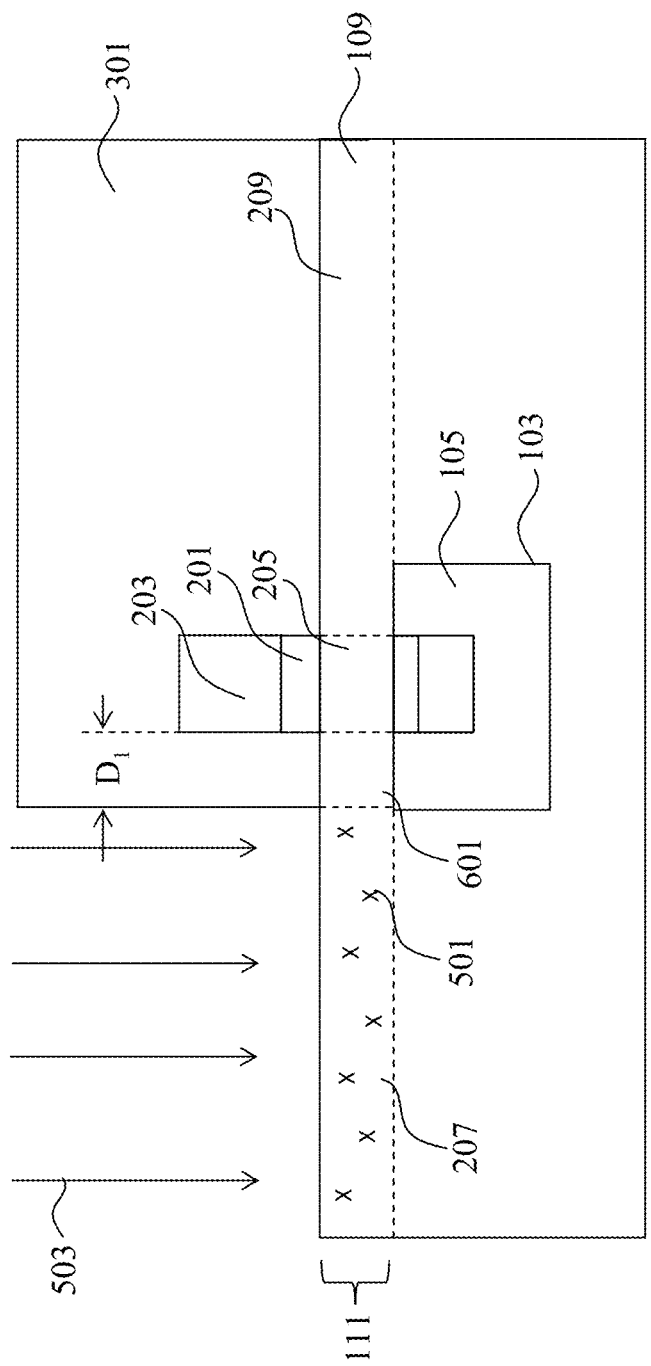
FIG. 7 illustrates an implantation of the second dopants with an offset in accordance with some embodiments.

FIG. 7 illustrates an embodiment in which, instead of implanting the first dopants 305 into the first source region 207 with the first implantation mask 301 covering the first portion 601 of the first source region 207, the second dopants 501 may be implanted into the first source region 207 while the first portion 601 is covered by the first implantation mask 301. In this embodiment the second dopants 501 may be implanted with the second implantation process 503 (as described above with respect to FIG. 5), and then annealed.

By covering the first portion of the first source region 207 with a lateral offset from the boundary of the first source region 207 and the first channel region 205, the second dopants 501 may still be implanted to assist in the removal of minority carriers from the first channel region 205. However, with the offset, the second implantation process 503 will have a smaller effect on the barrier between the first source region 207 and the first channel region 205, thereby helping to keep the barrier free of defects.

Additionally, while embodiments are described above that implant the first dopants 305 and the second dopants 501 separately from each other, these embodiments are described as such merely to be illustrative and are not intended to limit the embodiments. For example, in other embodiments the first source region 207 may be implanted with both the first dopants 305 and the second dopants 501 and then annealed in an effort to reduce the minority carrier lifetime within the first source region 207 and remove the minority carriers from the first channel region 205. Any suitable combination of implants may be utilized, and all such combinations are fully intended to be included within the scope of the embodiments.

Figure 8:
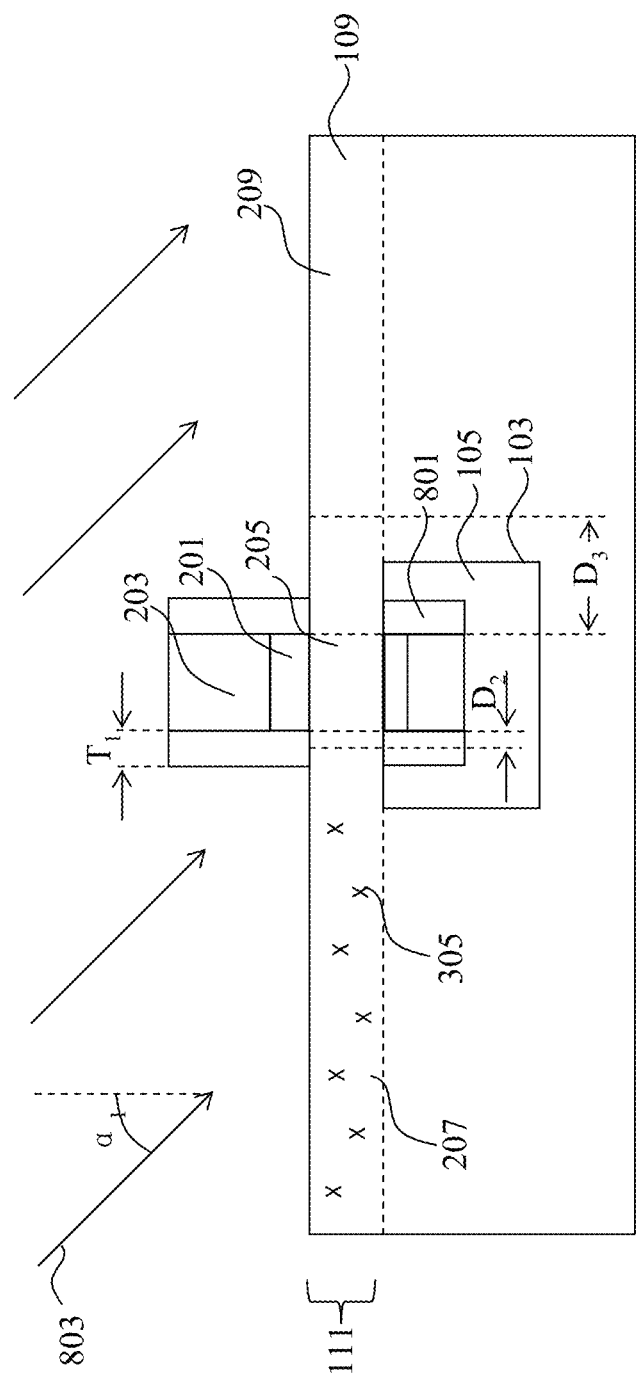
FIG. 8 illustrates an implantation of dopants at a first angle in accordance with some embodiments.

FIG. 8 illustrates yet another embodiment in which the first implantation mask 301 is not placed to cover the first channel region 205 and the drain region 209. In this embodiment, however, spacers 801 may be formed adjacent to the gate electrode 203 and the gate dielectric 201. In an embodiment the spacers 801 may be formed to surround the horizontal nanowire 111 (by initially patterning the gate electrode 203 and the gate dielectric 201 to have room for the spacers 801 within the first epitaxy layer 105. Once there is space for the spacers 801, the spacers 801 may be formed by depositing a dielectric material, such as silicon nitride, using a conformal deposition process such as chemical vapor deposition or atomic layer deposition. Once the material for the spacers 801 has been deposited, the spacers 801 may be patterned using, e.g., an anisotropic etching process to have a first thickness $T_1$ of between about 4 nm and about 20 nm, such as about 10 nm.

Once the spacers 801 have been formed, a third implantation process (represented in FIG. 8 by the arrows labeled 803) may be performed at a first angle $\alpha_1$, of between about 30° and about 60°, such as about 45° in order to implant the first dopants 305. In an embodiment the third implantation process 803 may be similar to the first implantation process 303, such as by being an ion implantation process. However, by implanting at the first angle $\alpha_1$, the first dopants 305 may be implanted within the first source region 207 but not into the first channel region 205. Additionally, while the first dopants 305 may be implanted into the drain region 209 as well, the spacers 801, the gate dielectric 201 and the gate electrode 203 will block implantation into a region that is adjacent to the interface between the drain region 209 and the first channel region 205.

In a particular embodiment in which the spacers 801 have the first thickness $T_1$ of about 10 nm and the third implantation process 803 has the first angle $\alpha_1$ of about 45°, the first dopants 305 may be located a second distance $D_1$ away from the junction of the first source region 207 and the first channel region 205 of between about 0 nm and about 10 nm, such as about 5 nm. Additionally, the first dopants 305 may be implanted into the drain region 209 a third distance $D_3$ from the interface of the drain region 209 and the first channel region 205 of between about 20 nm and about 40 nm, such as about 30 nm.

Additionally, while the third implantation process 803 is described above as implanting the first dopants 305, this is intended to be illustrative and is not intended to be limiting. Rather, the third implantation process 803 may be utilized to implant the second dopants 501 or a combination of the first dopants 305 and the second dopants 501. Any suitable implantation of dopants may be utilized, and all such implantations are fully intended to be included within the scope of the embodiments.

By implanting the first dopants 305 at an angle, the first dopants 305 or the second dopants 501 (or both) may be implanted into the first source region 207 without the use of the first implantation mask 301. As such, fewer process steps may be used for the implantation step, and a more streamlined and efficient implantation process may be utilized.

Once the horizontal nanowire active device 200 has been formed as described above in the embodiments of FIGS. 1A-8, any additional processing may be performed to integrate the horizontal nanowire active device 200 with other devices to form, e.g., a semiconductor die or other semiconductor device. For example, conductive contacts may be formed in electrical connection with the first source region 207, the first drain region 209, and the gate electrode 203. Additionally, dielectric and metallization layers may be formed over the horizontal nanowire active device 200 in order to interconnect the horizontal nanowire active device 200 with other passive and/or active devices (not separately illustrated).

FIGS. 9A-9B (with FIG. 9B being a right angle view of FIG. 9A) illustrate another embodiment which utilizes a vertical nanowire 911 (with a longitudinal axis perpendicular to a major surface of the second substrate 901) instead of the horizontal nanowire 111. In this embodiment there is a vertical gate all around (VGAA) transistor 900 that has a second substrate 901 with a vertical nanowire 911 oriented along a <111> crystalline orientation, a first contact pad 903, a second gate dielectric 902, and a second gate electrode 905. In an embodiment the second substrate 901 comprises a semiconductor substrate (e.g., Si or SiGe). In alternative embodiments, the second substrate 901 comprises a silicon-on-insulator (SOI) structure. In some embodiments, the second substrate 901 may comprise a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; or combinations thereof.

In some embodiments, the second substrate 901 may comprise various doped regions (not individually illustrated) depending on design desires (e.g., p-type substrate or n-type substrate). For example, the doped regions may be doped with p-type dopants, such as boron or $BF_2$; n-type dopants, such as phosphorus or arsenic; and/or combinations thereof. The doped regions may be configured for an n-type VGAA transistor, or alternatively configured for a p-type VGAA transistor.

To help isolate the various doped regions, first isolation regions 904 may be formed in the second substrate 901. In an embodiment the first isolation regions 904 may be formed by initially applying a fourth photoresist (not illustrated in FIGS. 9A-9B) on the second substrate 901, which is then patterned, forming openings in the fourth photoresist and then used as a mask to form trenches within the within the second substrate 901. The trenches may then be filled with a dielectric material, followed by a chemical mechanical polish (CMP) to form the first isolation regions 904. The dielectric material may include silicon oxide. In some embodiments, other dielectric materials, such as silicon nitride, silicon oxynitride, fluoride-doped silicate glass (FSG), or a low-K dielectric material, may also be used. In an embodiment, the dielectric material may be formed using a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethylorthosilicate (TEOS) and ozone ($O_3$). In yet other embodiment, the dielectric material may be formed using a spin-on-dielectric (SOD) process, such as hydrogen silsesquioxane (HSQ) or methyl silsesquioxane (MSQ).

After formation of the first isolation regions 904, a fifth photoresist (not illustrated in FIGS. 9A-9B) is formed on the second substrate 901 and is then patterned, forming openings in the fifth photoresist to expose the second substrate 901 and define areas for the formation of the vertical nanowire 911 from the second substrate 901. In an embodiment the exposed second substrate 901 is etched to form the vertical nanowire 911 from the second substrate 901. The vertical nanowire 911 may be formed to have a third width $W_3$ of between about 4 nanometer and about 20 nanometers, such as about 10 nanometers, and a first height $H_1$ of between about 10 nanometer and about 1 micrometer, such as about 70 nanometers.

Once the vertical nanowire 911 has been formed, the fifth photoresist is removed using a process such as ashing, whereby the temperature of the fifth photoresist is increased until the fifth photoresist thermally decomposes. Next, a cleaning may be performed to remove a native oxide of the second substrate 901. The cleaning may be performed using diluted hydrofluoric (DHF) acid.

In some embodiments, a second drain region 912 (indicated in FIGS. 9A and 9B with a dashed line within the vertical nanowire 911) is formed by a fourth ion implantation process (not separately illustrated in FIGS. 9A-9B) in the bottom portion of the vertical nanowire 911. The second drain region 912 includes an n-type dopant (such as phosphorous) when the GAA transistor is n-type or a p-type dopant (such as boron) when the GAA transistor is p-type. In some embodiments, the second drain region 912 formed by the fourth ion implantation process is further annealed for activation by a third annealing process. The third annealing process may be implemented right after the fourth ion implantation process or may alternatively be implemented after the formation of other doped features for collective activation. In one embodiment, the third annealing process includes rapid thermal annealing (RTA). In other embodiments, the third annealing process alternatively includes laser annealing, spike annealing, millisecond anneal (MSA) or other suitable annealing technique.

Once the second drain region 912 has been formed, the first contact pad 903 is formed to provide electrical connection to the second drain region 912. In an embodiment the first contact pad 903 is formed of a conductive material such as aluminum, although other suitable materials, such as copper, tungsten, or the like, may alternatively be utilized. The first contact pad 903 may be formed using a process such as CVD or PVD, although other suitable materials and methods may alternatively be utilized. Once the material for the first contact pad 903 has been deposited, the material may be shaped into the first contact pad 903 using, e.g., one or more photolithographic masking and etching processes.

Once the first contact pad 903 has been formed, a second isolation region 906 is formed to isolate the second substrate 901 and the subsequently formed second gate electrode 905. In an embodiment the second isolation region 906 is formed over the first contact pad 903 and the second substrate 901 and provides isolation function to and properly configures various features of the VGAA transistor 900. In an embodiment the second isolation region 906 includes a dielectric material, such as silicon oxide. The second isolation region 906 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using chemical vapor deposition (CVD), physical vapor deposition (PVD), or spin-on process, performing a CMP process to remove a portion of the dielectric material above the vertical nanowire 911, and etching back the dielectric material to the desired height to help define the second drain region 912.

Once the second isolation region 906 has been formed, the second gate dielectric 902 and the second gate electrode 905 surrounding a second channel region 914 of the vertical nanowire 911 are formed. In an embodiment the second gate electrode 905 is formed to surround the second channel region 914 of the vertical nanowire 911 as well as to extend outwardly from the vertical nanowire 911 in order to allow for contact with the first gate contact 1111.

In some embodiments, the second gate dielectric 902 may include silicon oxide, silicon nitride, silicon oxynitride, or high-k dielectrics, such as metal oxides. Examples of metal oxides that may be used as high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the second gate dielectric 902 is a high-k dielectric layer with a thickness in the range of about 5 to 30 angstroms. The second gate dielectric 902 may be formed using a suitable process such as atomic layer deposition (ALD), chemical vapor deposition (CVD), physical vapor deposition (PVD), thermal oxidation, UV-ozone oxidation, or combinations thereof. The second gate dielectric 902 may further comprise an interfacial layer (not shown) to reduce damage between the second gate dielectric 902 and the second channel region 914 of the vertical nanowire 911. The interfacial layer may comprise silicon oxide.

Once the second gate dielectric 902 has been formed, the second gate electrode 905 may be formed. In an embodiment the second gate electrode 905 may be formed by initially forming a layer of metal (not separately illustrated in FIGS. 9A-9B) over the second gate dielectric 902. In some embodiments, the layer of metal may comprise a single layer or a multilayer structure. In the present embodiment, the layer of metal may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer comprises a uniform thickness in the range of about 1 nanometer to about 20 nanometers. The layer of metal may be formed using a suitable process such as ALD, CVD, PVD, plating, or combinations thereof.

Once the layer of metal has been formed, the layer of metal may be patterned to separate the second gate electrode 905 illustrated in FIGS. 9A-9B from other gate electrodes also formed from the layer of metal (not separately illustrated in FIGS. 9A-9B) by being selectively etched. In an embodiment the layer of metal may be patterned to form the second gate electrode 905 by initially applying a sixth photoresist (not separately illustrated in FIGS. 9A-9B) and then patterning the sixth photoresist to expose a portion of the layer of metal that is desired to be removed and to cover a portion of the layer of metal that is desired to remain.

After patterning the sixth photoresist to expose the layer of metal, the layer of metal is etched using the sixth photoresist as a mask. In some embodiments, partially removing the exposed portion of the layer of metal is performed using a dry etch process at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as an etching gas. Once the layer of metal has been patterned, the sixth photoresist is removed using a process such as, e.g., ashing.

Once the layer of metal has been patterned to separate the second gate electrode 905 from other gate electrodes, the layer of metal may also be patterned to define the second channel region 914 of the vertical nanowire 911. In an embodiment the layer of metal may be patterned in this direction by initially forming a third isolation region 908 over the layer of metal. In an embodiment the third isolation region 908 includes a dielectric material such as silicon oxide. The third isolation region 908 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using CVD, PVD, or spin-on process, performing a CMP process to remove a portion of the dielectric material above the vertical nanowire 911, and etching back the dielectric material to a desired height to help define the second channel region 914.

Once the third isolation region 908 has been formed to help define the second channel region 914, the third isolation region 908 may be used as a mask to help remove exposed portions of the layer of metal from over the vertical nanowire 911 and form the second gate electrode 905 surrounding the second channel region 914 of the vertical nanowire 911. In some embodiments, partially removing the exposed portion of the remaining layer of metal is performed using a dry etch process at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as an etching gas.

Once the second channel region 914 has been defined by the second gate electrode 905, a second source region 916 may be formed in a portion of the vertical nanowire 911 uncovered by the second gate electrode 905. In an embodiment, the second source region 916 is formed by a fifth ion implantation process in the upper portion of the vertical nanowire 911. The second source region 916 includes an n-type dopant (such as phosphorous) when the VGAA transistor 900 is n-type or a p-type dopant (such as boron) when the VGAA transistor 900 is p-type. In some embodiments, the second source region 916 formed by the fifth ion implantation is further annealed for activation by an annealing process. The annealing process is implemented after the fifth ion implantation or is alternatively implemented after the formation of other doped features for collective activation. In one embodiment, the annealing process includes rapid thermal annealing (RTA). In other embodiments, the annealing process alternatively includes laser annealing, spike annealing, millisecond anneal (MSA) or other suitable annealing technique.

In this embodiment, after the second source region 916 has been formed within the vertical nanowire 911, the first dopants 305 may be implanted within the second source region 916 in order to amorphize the second source region 916. In an embodiment the first dopants 305 may be implanted using a sixth implantation process (represented in FIG. 9A by the arrow labeled 921), which may be similar to the first implantation process 303, such as by being an ion implantation process. Additionally, the sixth implantation process 921 may also be tuned to help limit the implant to the second source region 916 and have a minimal impact upon the majority carrier transport properties of the VGAA transistor 900. As such, while the sixth implantation process 921 may be dependent upon the height of the second source region 916 of the vertical nanowire 911, in an embodiment in which the second source region 916 has a second height $H_2$ of about 20 nm, the sixth implantation process 921 may use an implantation energy of between about 1 keV and about 5 keV, such as about 2 keV, although any suitable implantation energy may alternatively be used.

In an embodiment the first dopants 305 may be implanted to an average concentration (throughout the second source region 916) of between about $10^{19}/cm^3$ to about $5\times 20^{20}/cm^3$, such as about $1\times 20^{20}/cm^3$. Additionally, in order to help limit the implant to the second source region 916 reduce any impacts to the transport of the VGAA transistor 900, the sixth implantation process 921 may be tuned such that a peak concentration of the first dopants 305 (e.g., a concentration of about $2\times 20^{20}/cm^3$) may be located a fourth distance $D_4$ from the boundary between the second source region 916 and the second channel region 914 of between about 0 nm and about 20 nm. However, any suitable concentrations may alternatively be utilized.

FIGS. 10A-10B (with FIG. 10B being a right angle view of FIG. 10A) illustrate that, once the first dopants 305 have been implanted into the second source region 916, a fourth annealing process 1001 may be utilized to recrystallize the second source region 916 with the first dopants 305. In an embodiment the fourth annealing process 1001 may be similar to the first anneal process 401 (described above with respect to FIG. 4). For example, the fourth annealing process 1001 may be performed at a temperature of between about 300° C. and about 1000° C., such as about 400° C., for a time period of between about 1 s and about 30 min, such as about 1 min.

By implanting the first dopants 305 and then annealing the second source region 916, the second source region 916 will be recrystallized into a polycrystalline structure. Such a polycrystalline structure helps in the recombination of minority carriers within the second source region 916, thereby reducing the lifetime of minority carriers within the second source region 916 and, over time, reducing a concentration of the minority carriers within the second source region 916. With such a reduction in the number of minority carriers in the second source region 916, minority carriers that are generated at the junction of the second drain region 912 and the second channel region 914 may be driven to the second source region 916 and out of the second channel region 914. The reduction in the minority carriers within the second channel region 914 assists in reducing the off-current of the VGAA transistor 900.

FIGS. 11A-11B (with FIG. 11B being a right angle view of FIG. 11A) illustrate that, once the second gate electrode 905 and the second source region 916 have been formed with the first dopants 305, a fourth isolation region 1101 may be formed to isolate the second source region 916 within the vertical nanowire 911. In an embodiment the fourth isolation region 1101 includes a dielectric material, such as silicon oxide. The fourth isolation region 1101 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material includes depositing a dielectric material using, e.g., CVD, PVD, or a spin-on process, and then performing a CMP process to remove a portion of the dielectric material above the vertical nanowire 911.

Once the fourth isolation region 1101 has been formed, the second contact pad 1103 may be formed in electrical connection with the second source region 916. In an embodiment the second contact pad 1103 is formed in order to provide electrical connection between the second source region 916 within the vertical nanowire 911 and, e.g., a first top contact 1105. In an embodiment the second contact pad 1103 is formed of a conductive material such as aluminum, although other suitable materials, such as copper, tungsten, or the like, may alternatively be utilized. The second contact pad 1103 may be formed using a process such as CVD or PVD, although other suitable materials and methods may alternatively be utilized. Once the material for the second contact pad 1103 has been deposited, the material may be shaped into the second contact pad 1103 using, e.g., a photolithographic masking and etching process.

After the second contact pad 1103 has been formed, a fifth isolation region 1107 may be formed to help isolate the second contact pad 1103. In an embodiment the fifth isolation region 1107 includes a dielectric material such as silicon oxide. The fifth isolation region 1107 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using CVD, PVD, or a spin-on process. If desired, a CMP process may be utilized to planarize the fifth isolation region 1107.

Once the VGAA transistor 900 has been formed, a first bottom contact 1109, a first gate contact 1111, and a first top contact 1105 may be formed in order to electrically connect the second drain region 912, the second source region 916, and the second gate electrode 905. In an embodiment the first bottom contact 1109, the first gate contact 1111, and the first top contact 1105 may be formed either together or separately by initially applying a seventh photoresist, patterning the seventh photoresist, and then removing portions of the fifth isolation region 1107, the fourth isolation region 1101, the third isolation region 908, and the second isolation region 906 to form openings and to expose portions of the second contact pad 1103, the second gate electrode 905, and the first contact pad 903.

Once the openings have been formed, the openings may be filled with a conductive material. In an embodiment the conductive material may be tungsten, although any suitable material may be used, and may be formed by initially forming a seed layer within the openings and then using a process such as plating in order to fill or overfill the openings with the conductive material. Once filled, any excess conductive material located outside of the openings may be removed using, e.g., a chemical mechanical polishing process.

Figure 12A:
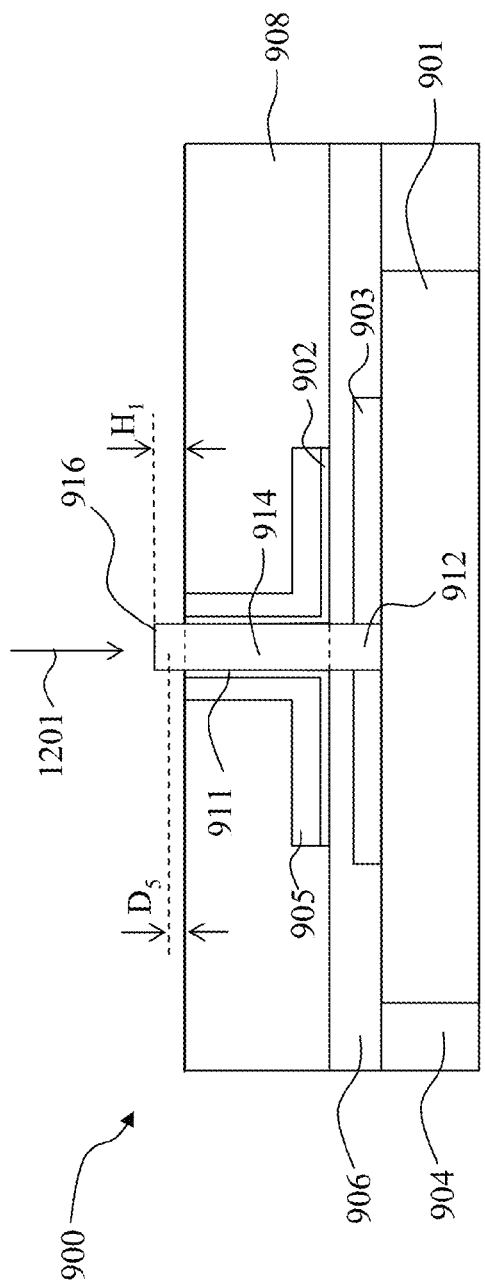
FIGS. 12A-12B illustrate an implantation of second dopants in accordance with some embodiments.
Figure 12B:
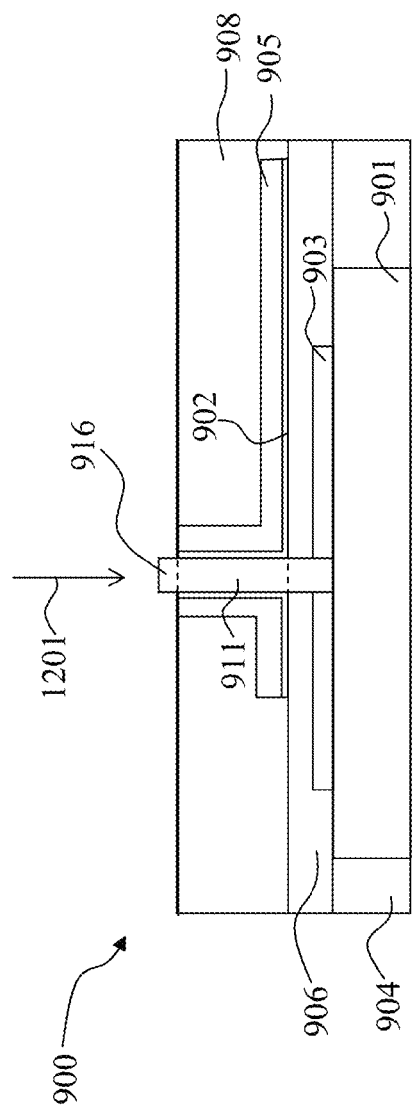

FIGS. 12A-12B (with FIG. 12B being a right angle view of FIG. 12A) illustrate another embodiment in which, rather than the first dopants 305 being implanted into the second source region 916, the second dopants 501 are implanted instead. In this embodiment the second dopants 501 may be implanted using a seventh implantation process 1201 which may be similar to the second implantation process 503, such as by being an ion implantation process. Additionally, the seventh implantation process 1201 may be tuned in order to have a minimal impact upon the transport profiles of the device. In this embodiment the seventh implantation process 1201 may implant the ions with an implantation energy of between about 1 keV and about 20 keV, such as about 4 keV.

In this embodiment the second dopants 501 may be implanted to an average concentration (throughout the second source region 916) of between about $10^{14}/cm^3$ and about $10^{18}/cm^3$, such as about $10^{17}/cm^3$. Additionally, in order to help reduce the transport profiles of the VGAA transistor 900, the seventh implantation process 1201 may be tuned such that a peak concentration of the second dopants 501

(e.g., a concentration of about $2\times10^{17}/cm^3$) may be located a fifth distance $D_5$ from the boundary between the second source region 916 and the second channel region 914 of between about 0 nm and about 20 nm.

Additionally, once the second dopants 501 have been implanted into the second source region 916, the second annealing process (not separately illustrated in FIGS. 12A-12B) may be performed in order to repair any damage that occurred during the seventh implantation process 1201. In an embodiment the second annealing process may be performed as described above with respect to FIG. 5. For example, the second annealing process may be performed at a temperature of between about 300° C. and about 1000° C., such as about 400° C., for a time period of between about 1 s and about 30 min, such as about 1 min. However, any suitable annealing process may alternatively be utilized.

By implanting the second dopants 501 which will directly reduce the lifetime of the minority carriers within the second source region 916, the recombination of minority carriers within the second source region 916 will be enhanced. Such an enhancement will lead, over time, to the second source region 916 having a smaller concentration of minority carriers. This lowered concentration of minority carriers will work to remove the minority carriers from the second channel region 914, thereby increasing the efficiency of the overall device.

Figure 13A:
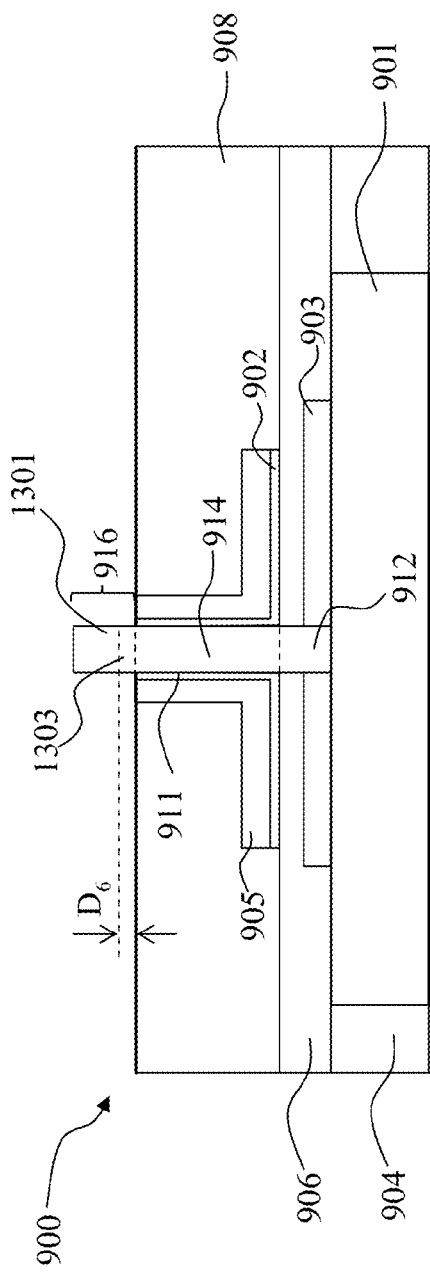
FIGS. 13A-13B illustrate a regrowth of a third source region in accordance with some embodiments.
Figure 13B:
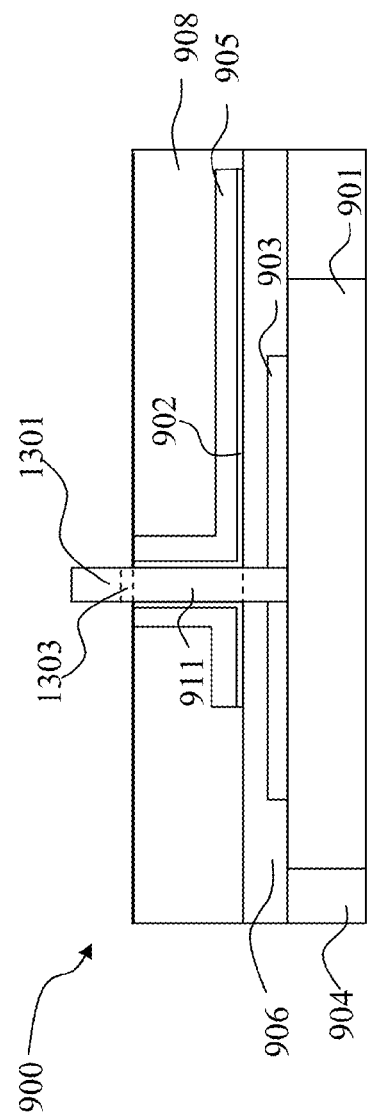

FIGS. 13A-13B (with FIG. 13B being a right angle view of FIG. 13A) illustrate an embodiment in which a portion of the second source region 916, instead of being implanted with the first dopants 305 or the second dopants 501, is removed and regrown to form a third source region 1301 that has either the second dopants 501, incorporated without an implantation process. After removal, a second portion 1303 of the second source region 916 remains behind, wherein the second portion 1303 and the regrown third source region 1301 collectively form the second source region 916. In this embodiment, a portion of the second source region 916 is removed using an etching process, such as a wet etch process, whereby an etchant selective to the material of the second source region 916 (e.g., silicon) is applied to remove the second source region 916. In an embodiment the second source region 916 may be removed until the second portion 1303 has a sixth distance $D_6$ that offsets the third source region 1301 of between about 0 nm and about 10 nm, such as about 4 nm from the second channel region 914, although the precise dimensions of the sixth distance $D_6$ may be modified to tune a ratio of the on-current $I_{on}$ to the off-current $I_{off}$ of the VGAA transistor 900.

Once the second source region 916 has been removed, the third source region 1301 may be epitaxially regrown using, e.g., an epitaxial growth process to regrow the third source region 1301 with, e.g., the same material as the remainder of the vertical nanowire 911. However, in addition to regrowing the second source region 916, the second dopants 501 are introduced as the third source region 1301 is being grown. In an embodiment the epitaxial growth process may use precursors such as silane ($SiH_4$) or dichlorosilane ($SiCl_2H_2$) in order to grow the semiconductor material (e.g., silicon) of the third source region 1301, while a suitable precursor such as nickel tetracarbonyl ($Ni(CO)_4$), dicobalt octocarbonyl ($Co_2(CO)_8$), tetrakis(ethylmethylamino)titanium ($Ti[N(CH_3)C_2H_5]_4$) is also added in order to incorporate the second dopants 501 during the growth. The epitaxial growth may be performed at a temperature of between about 500° C. and about 700° C. such as about 650° C.

By removing the second source region 916 and growing the third source region 1301, the second dopants 501 may be incorporated to a concentration of between about $10^{14}/cm^3$ to about $10^{18}/cm^3$. As such, the second dopants 501 are incorporated as part of the third source region 1301, where they can be used to enhance recombination of the minority carriers and, over time, lower the minority carrier concentration of the third source region 1301. As such, minority carriers within the second channel region 914 may be driven into the third source region 1301 and out of the second channel region 914 without the need for a separate implantation process.

Alternatively, instead of or in addition to introducing the second dopants 501 into the third source region 1301 as the third source region 1301 is being grown, the third source region 1301 may be grown with the same material as the remainder of the vertical nanowire 911 but using sub-optimal conditions for epitaxial growth. By forming the third source region 1301 with sub-optimal conditions, the third source region 1301 will be formed with an increase in crystalline defects, such as having polycrystalline grains with a grain size between 1 nm and 10 nm, or point defects with a concentration between $10^{15}/cm^3$ and $10^{18}/cm^3$. Such an increase in defects will enhance the recombination of minority carriers within the third source region 1301 and, over time, lower the concentration of minority carriers within the third source region, which will assist in the removal of minority carriers from the second channel region 914.

To achieve the increase in crystalline defects during the epitaxial growth process, one or more of the growth parameters may be modified to sub-optimal conditions. In an embodiment one of the parameters that may be modified is the growth temperature, wherein the temperature may be lowered in order to generate additional crystalline defects. For example, the third source region 1301 may be epitaxially grown at a temperature of between about 300° C. and about 500° C., such as about 400° C. However, any suitable temperature, and any other suitable process conditions, such as modifying the flow rates of the precursors, that help in increasing the crystalline defects may alternatively be utilized.

In yet another embodiment, instead of using the same material to regrow the third source region 1301 as was originally in the vertical nanowire 911 (e.g., silicon), the third source region 1301 may be regrown with a material that has a large lattice mismatch, such as a lattice mismatch with a larger than 1% difference, with respect to the material of the remaining vertical nanowire 911 (e.g., the second portion 1303). For example, in an embodiment in which the second portion 1303 is germanium, the third source region 1301 may be regrown with a material such as silicon (which has a >3% mismatch to germanium). Similarly, in an embodiment in which the second portion 1303 is indium gallium arsenide (InGaAs), the third source region 1301 may be regrown with a material such as indium arsenide (InAs—which has a >3% mismatch to $In_{0.53}Ga_{0.47}As$), and in an embodiment in which the second portion 1303 is indium arsenide, the third source region 1301 may be regrown with a material such as indium gallium arsenide (which has a >3% mismatch). However, any suitable combination of materials may alternatively be utilized.

By utilizing materials with different lattices constants to form a lattice constant mismatch, a larger number of dislocations may be generated in the third source region 1301 adjacent to the second portion 1303 of the second source region 916. For example, in an embodiment using materials with a large lattice mismatch, the dislocation density may be between about $10^6/cm^2$ and about $10^8/cm^2$. Such an increase in dislocation density will also work to enhance the recombination of minority carriers within the third source region 1301 and reduce the lifetime of the minority carriers within the third source region 1301 and assist in the removal of the lifetime carriers from the second channel region 914.

Figure 14A:
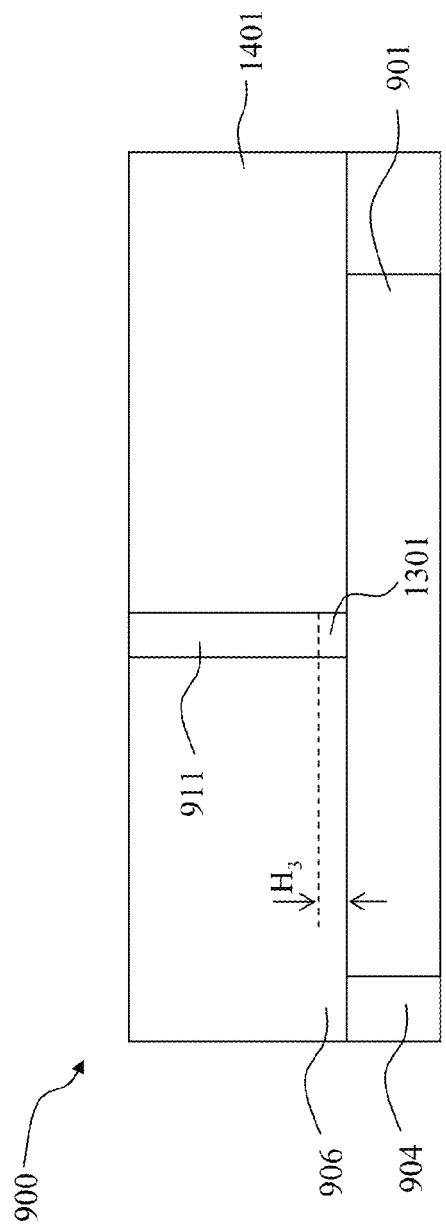
FIGS. 14A-14B illustrate a growth of the third source region adjacent to the substrate in accordance with some embodiments.
Figure 14B:
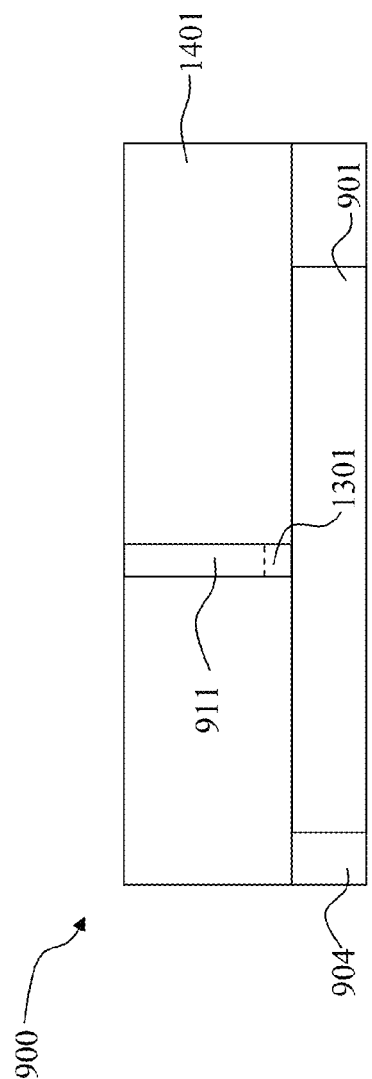

FIGS. 14A-14B (with FIG. 14B being a right angle view of FIG. 14A) illustrate yet another embodiment in which the vertical nanowire 911 is formed with the third source region 1301 at the bottom (e.g., closer to the second substrate 901) while the second drain region 912 is formed at the top (e.g., further from the second substrate 901) of the vertical nanowire 911. In this embodiment, rather than patterning the second substrate 901 to form the vertical nanowire 911, the vertical nanowire 911 may instead be grown using the substrate 901 as a template for an epitaxial growth process.

In an embodiment the vertical nanowire 911 may be formed by initially placing an epitaxial mask 1401 over the second substrate 901 and, if desired, over the first isolation regions 904. The epitaxial mask 1401 may be, e.g., a ninth photoresist that may be placed and then patterned using a patterned light source and development to form an opening that exposes the second substrate 901 where the vertical nanowire 911 is desired to be formed and also in the desired shape of the vertical nanowire 911.

Once the epitaxial mask 1401 has been formed and the second substrate 901 is exposed, the third source region 1301 may be grown on the second substrate 901 within the epitaxial mask 1401 using, e.g., an epitaxial growth process. In an embodiment the epitaxial growth process may be initiated using precursors such as silane ($SiH_4$) or dichlorosilane ($SiCl_2H_2$) that will form a material that is the same as the second substrate 901. Additionally, in an embodiment the second dopants 501 may be incorporated into the third source region 1301 as the third source region 1301 is being grown within the epitaxial mask 1401. The second dopants 501 may be incorporated as described above with respect to FIGS. 13A-13B, although any suitable process of incorporating the second dopants 501 may alternatively be utilized. The third source region 1301 may be formed to a third height $H_3$ of between about 4 nm and about 20 nm, such as about 10 nm.

Once the third source region 1301 has been formed, the remainder of the vertical nanowire 911 may be grown within the epitaxial mask 1401 from the third source region 1301. In an embodiment the remainder of the vertical nanowire 911 may be formed by maintaining the epitaxial growth process but stopping the introduction of the second dopants 501. As such, the remainder of the vertical nanowire 911 may be grown without the second dopants 501, and may be grown to fill and overfill the epitaxial mask 1401. If desired, the vertical nanowire 911 may be planarized after epitaxial growth using, e.g., a CMP process, so that the vertical nanowire 911 is planar.

Alternatively, instead of incorporating the second dopants 501 into the third source region 1301, the third source region 1301 may be epitaxially grown using sub-optimal process conditions in order to generate additional defects within the material of the third source region 1301. In an embodiment the sub-optimal process conditions may be as described above with respect to FIGS. 13A-13B. For example, the epitaxial growth process may be performed at a reduced temperature or other sub-optimal process parameter in order to increase the number of defects within the third source region 1301.

In this embodiment, once the third source region 1301 has been grown using the second substrate 901 as a template material, the remainder of the vertical nanowire 911 may be grown by modifying the process parameters of the growth process. For example, in an embodiment in which a lowered temperature is utilized to grow the third source region 1301, the temperature of the epitaxial growth process may be increased, e.g., to 650° C., for the growth of the remainder of the vertical nanowire 911. However, any suitable process parameters may alternatively be modified.

In yet another embodiment the third source region 1301 may be grown with a different material than the second substrate 901 such that there is a large lattice mismatch between the second substrate 901 and the third source region 1301. For example, in an embodiment in which the second substrate 901 is germanium, the third source region 1301 may be grown with a material such as silicon (which has a >3% mismatch to germanium). Similarly, in an embodiment in which the second substrate 901 is indium gallium arsenide (InGaAs), the third source region 1301 may be grown with a material such as indium arsenic (InAs—which has a >3% mismatch to $In_{0.53}Ga_{0.47}As$), and in an embodiment in which the second substrate 901 is indium arsenide, the third source region 1301 may be grown with a material such as indium gallium arsenide (which has a >3% mismatch). However, any suitable combination of materials may alternatively be utilized. By utilizing a different material with a large lattice constant mismatch, a defect density may be increased in a region adjacent to the second substrate 901 as described above with respect to FIGS. 13A-13B.

In this embodiment, once the third source region 1301 has been grown with a different material than the second substrate 901, the remainder of the vertical nanowire 911 may be grown by simply continuing the epitaxial growth process to form the vertical nanowire 911 with the same material as the third source region 1301. However, any suitable process parameters may alternatively be modified.

In yet another embodiment (not separately illustrated) in which the vertical nanowire 911 is grown using the second substrate 901 as a template, the second drain region 912 may be grown adjacent to the second substrate 901, and the third source region 1303 may be grown as illustrated in FIGS. 13A-13B. In this embodiment, the vertical nanowire 911 is grown and, when it is desired to form the third source region 1301, the parameters of the growth process are modified as described above with respect to FIGS. 13A-13B. For example, the second dopants 503 may be included during the growth process, the deposition parameters may be modified to be sub-optimal, or the precursors may be changed in order to grow a material with a large lattice constant mismatch. Such a structure will look similar to the structure of FIGS. 13A-13B and, as such, are not repeated herein.

FIGS. 15A-15B illustrate that, once the third source region 1301 and the remainder of the vertical nanowire 911 have been formed, the remainder of the VGAA transistor 900 may be formed using the vertical nanowire 911. In particular, the second source region 916 may be formed from the third source region 1301 and the second portion 1303 of the vertical nanowire 911, and the second channel region 914 and the second drain region 912 may be formed within the vertical nanowire 911. These regions may be formed with one or more series of implants as described above with respect to FIGS. 9A-9B.

However, with the inclusion of the second portion 1303 of the second source region 916, the third source region 1301 (with the lifetime reducing characteristics such as the second dopants 501) will be offset from the second channel region 914. In an embodiment this offset may be a sixth distance $D_6$ of between about 0 nm and about 10 nm. However, any suitable distance may alternatively be utilized.

FIGS. 15A-15B additionally illustrate that, in addition to the second channel region 914 and the second drain region 912, other elements of the VGAA transistor 900 may be formed. For example, the second gate dielectric 902, the second gate electrode 905, the various isolation regions (e.g., fourth isolation region 1101, etc.), and the others structures may be formed as described above with respect to FIGS. 9A-9B and 10A-10B. However, any other suitable structures may alternatively be utilized.

FIGS. 16A-16B illustrate simulation data from technology computer aided design that illustrates the effects of reducing minority carrier lifetime within a source region. In these figures, by changing the minority carrier lifetime from 10 ns (which may be typical for a high-quality crystalline material) to 10 ps (typical for a poor quality crystalline material), there can be a 1000× reduction in the off-current ($I_{\mathit{off\_min}}$). In particular, FIG. 16A illustrates one-half of a modeled cylindrical vertical nanowire wherein the modeled source 1601 is indium arsenide and is adjacent to a modeled spacer 1603 of silicon dioxide. The modeled vertical nanowire additionally has a modeled channel region 1605 and a modeled drain region 1607, with a modeled gate dielectric 1609 of hafnium oxide adjacent to the modeled channel region 1605.

FIG. 16B illustrates a chart of current versus voltage for various minority carrier lifetimes. In this chart, the line labeled 1621 illustrates a minority carrier lifetime of 10 ns, the line labeled 1623 illustrates a minority carrier lifetime of 1 ns, the line labeled 1625 illustrates a minority carrier lifetime of 100 ps, the line labeled 1627 illustrates a minority carrier lifetime of 10 ps. As can be seen, when the minority carrier lifetime is reduced from 10 ns to 10 ps, there is a 1000× reduction in the lowest off-current of the device.

Given this, by utilizing the process and structures as described herein, the source of devices formed within nanowires may be engineered such that minority carriers within the source regions have a reduced minority carrier lifetime. Such a reduction will work to remove the concentration of minority carriers within the channel region, and reduce the off-current of the overall device. As such, devices that are more efficient and use less energy may be manufactured.

In accordance with an embodiment, a method of manufacturing a semiconductor device comprising forming a nanowire over a substrate, wherein the nanowire comprises a source, a drain, and a channel between the source and the drain is provided. A portion of the drain is covered, and a first minority carrier lifetime reducing dopant is implanted into the source after the covering the portion of the drain.

In accordance with another embodiment, a method of manufacturing a semiconductor device comprising forming a source region, a drain region, and a channel region within a nanowire is provided. The source region is modified to reduce the minority carrier lifetime within the source region.

In accordance with yet another embodiment, a semiconductor device comprising a nanowire with a source region, a drain region, and a channel region between the source region and the drain region is provided. First dopants are within the source region, wherein the first dopants are minority carrier lifetime reducing dopants and have a different concentration within the source region than within the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a nanowire over a substrate, wherein the nanowire comprises a channel;
    implanting a first dopant into the nanowire to form a source and a drain in the nanowire, the channel disposed between the source and the drain, wherein the source has a first conductivity type and the drain has the first conductivity type;
    covering a portion of the drain; and
    implanting a first minority carrier lifetime reducing dopant into the source after the covering the portion of the drain, the first minority carrier lifetime reducing dopant different from the first dopant, wherein the first minority carrier lifetime reducing dopant is substantially confined to the source, and wherein the channel is substantially free of the first minority carrier lifetime reducing dopant.

2. The method of claim 1, wherein the implanting the first minority carrier lifetime reducing dopant further comprises implanting an amorphizing dopant into the source.

3. The method of claim 2, further comprising annealing the source to recrystallize the source into a polycrystalline material.

4. The method of claim 1, wherein the implanting the first minority carrier lifetime reducing dopants implants the first minority carrier lifetime reducing dopants at a non-perpendicular angle.

5. The method of claim 1, wherein the first minority carrier lifetime reducing dopants directly reduce a lifetime of minority carriers within the source.

6. The method of claim 1, wherein the nanowire has a longitudinal axis parallel with the substrate.

7. The method of claim 1, wherein the nanowire has a longitudinal axis perpendicular with the substrate.

8. A method of manufacturing a semiconductor device, the method comprising:
    forming a source region, a drain region, and a channel region within a nanowire, wherein the source region has a first conductivity type and the drain region has the first conductivity type;
    forming a first spacer on the nanowire, the first spacer covering a portion of the source region;
    forming a second spacer on the nanowire, the second spacer covering a portion of the drain region; and
    modifying the source region and the drain region to reduce a minority carrier lifetime within the source region and the drain region using a first modification process, wherein the source region and the drain region are part of a MOSFET, and wherein parameters of the first modification process are chosen to avoid modifying portions of the channel region adjacent the source region and portions of the drain region under the second spacer.

9. The method of claim 8, wherein the first modification process comprises implanting dopants into the source region.

10. The method of claim 9, wherein the dopants are amorphizing dopants.

11. The method of claim 9, wherein the dopants directly reduce a lifetime of minority carriers.

12. The method of claim 8, wherein the source region comprises a first semiconductor material and modifying the source region further comprises:
   removing a portion of the first semiconductor material; and
   growing a second semiconductor material to replace the first semiconductor material.

13. The method of claim 12, wherein there is a lattice mismatch between the first semiconductor material and the second semiconductor material.

14. The method of claim 12, wherein the channel region comprises a third semiconductor material and the second semiconductor material has a defect concentration that is larger than the third semiconductor material.

15. A semiconductor device comprising:
   a nanowire with a source region, a drain region, and a channel region between the source region and the drain region, wherein the source region has a first conductivity type and the drain region has the first conductivity type, wherein the channel region is part of a MOSFET; and
   first dopants within and throughout the source region, wherein the first dopants are minority carrier lifetime reducing dopants and have a different concentration within the source region than within the drain region, wherein the junction between the source region and the channel region is substantially free of the first dopants, wherein the first dopants are one of nickel, cobalt, titanium, tantalum, oxygen, magnesium, or iron.

16. The semiconductor device of claim 15, wherein the source region comprises a polycrystalline material.

17. The semiconductor device of claim 15, wherein the first dopants directly reduce a lifetime of minority carriers within the source region.

18. The semiconductor device of claim 15, wherein the source region has a different lattice constant than the channel region.

19. The semiconductor device of claim 15, wherein the first dopants are offset from the channel region.

20. The semiconductor device of claim 19, wherein the offset is less than about 10 nm.

\* \* \* \* \*